United States Patent
Hammond et al.

(10) Patent No.: US 11,100,423 B2
(45) Date of Patent: Aug. 24, 2021

(54) ARTIFICIAL INTELLIGENCE ENGINE HOSTED ON AN ONLINE PLATFORM

(71) Applicant: Microsoft Technology Licensing, LLC, Redmond, WA (US)

(72) Inventors: Mark Isaac Hammond, Berkeley, CA (US); Keen McEwan Browne, Berkeley, CA (US); Marcos Campos, Carlsbad, CA (US); Matthew James Brown, San Francisco, CA (US); Ruofan Kong, Berkeley, CA (US); Megan Adams, San Francisco, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 821 days.

(21) Appl. No.: 15/416,970

(22) Filed: Jan. 26, 2017

(65) Prior Publication Data
US 2017/0213128 A1    Jul. 27, 2017

Related U.S. Application Data

(60) Provisional application No. 62/287,861, filed on Jan. 27, 2016.

(51) Int. Cl.
*G06N 20/00* (2019.01)
*G06F 16/951* (2019.01)
(Continued)

(52) U.S. Cl.
CPC .......... *G06N 20/00* (2019.01); *G06F 3/0482* (2013.01); *G06F 8/31* (2013.01); *G06F 8/311* (2013.01);
(Continued)

(58) Field of Classification Search
CPC .... G06F 9/451; G06F 16/2228; G06F 16/951; G06F 3/0482; G06F 8/31; G06F 8/38;
(Continued)

(56) References Cited

U.S. PATENT DOCUMENTS

| 5,619,618 A | 4/1997 | Bigus |
| 6,449,603 B1 | 9/2002 | Hunter |

(Continued)

FOREIGN PATENT DOCUMENTS

| CN | 101645083 A | 2/2010 |
| CN | 102141991 A | 8/2011 |

(Continued)

OTHER PUBLICATIONS

Campos, et al., "Concept Network Reinforcement Learning for Flexible Dexterous Manipulation", Retrieved From: https://medium.com/@BonsaiAI/concept-network-reinforcement-learning-for-flexible-dexterous-manipulation-47bf459b19b9, Sep. 19, 2017, 11 Pages.

(Continued)

*Primary Examiner* — Eric Nilsson
(74) *Attorney, Agent, or Firm* — Alleman Hall Creasman & Tuttle LLP

(57) ABSTRACT

Provided herein in some embodiments is an artificial intelligence ("AI") engine hosted on one or more remote servers configured to cooperate with one or more databases including one or more AI-engine modules and one or more server-side client-server interfaces. The one or more AI-engine modules include an instructor module and a learner module configured to train an AI model. An assembly code can be generated from a source code written in a pedagogical programming language describing a mental model of one or more concept modules to be learned by the AI model and curricula of one or more lessons for training the AI model. The one or more server-side client-server interfaces can be (Continued)

Figure 1A:
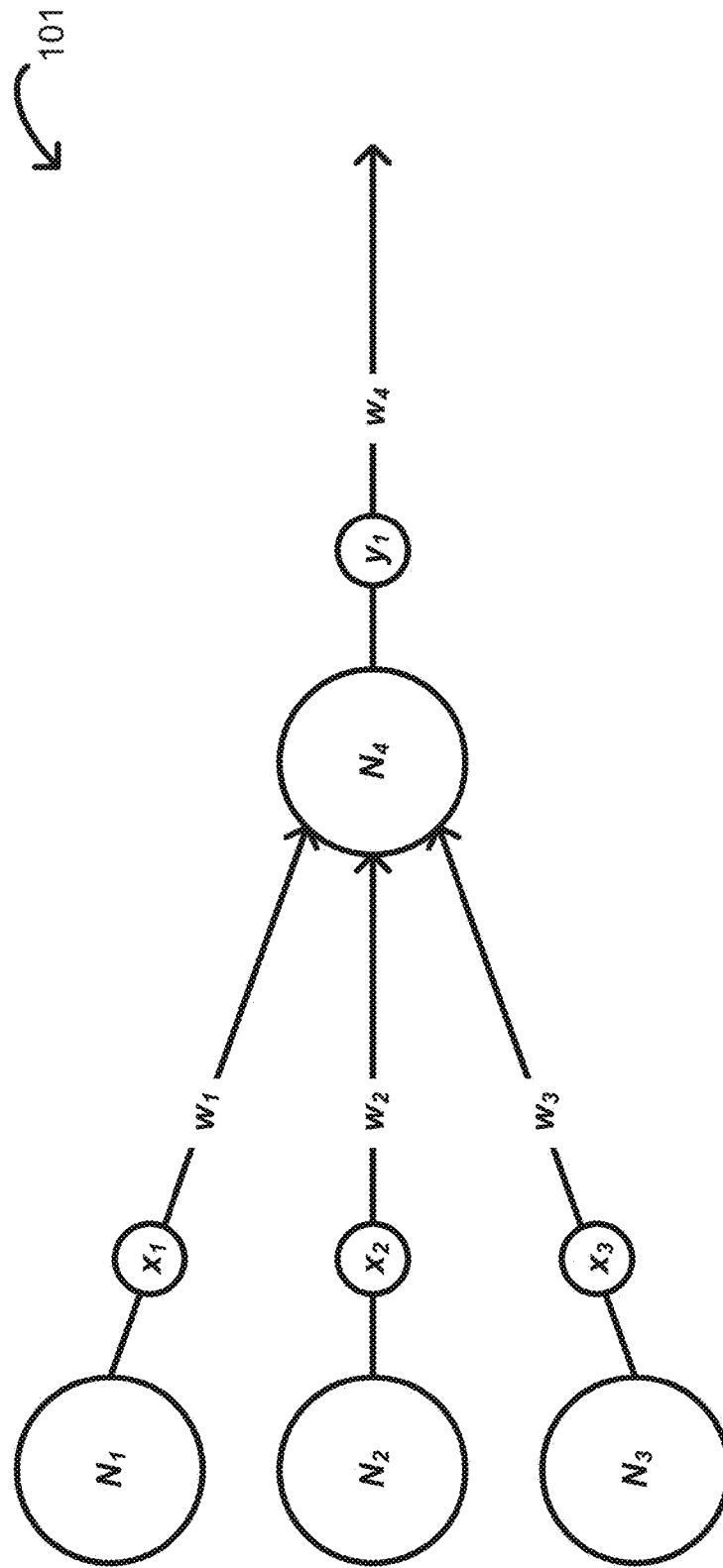

configured to enable client interactions from a local client such as submitting the source code for training the AI model and using the trained AI model for one or more predictions.

20 Claims, 13 Drawing Sheets

(51) Int. Cl.

| | |
|---|---|
| G06F 16/22 | (2019.01) |
| G06F 8/38 | (2018.01) |
| G06Q 10/00 | (2012.01) |
| G06N 3/10 | (2006.01) |
| G06F 30/20 | (2020.01) |
| G06F 8/30 | (2018.01) |
| G06N 3/08 | (2006.01) |
| G06N 3/04 | (2006.01) |
| H04L 29/06 | (2006.01) |
| G06F 9/451 | (2018.01) |
| G06F 3/0482 | (2013.01) |
| G06N 3/00 | (2006.01) |
| G06N 5/04 | (2006.01) |
| G06F 9/48 | (2006.01) |
| G06F 15/80 | (2006.01) |
| G06K 9/62 | (2006.01) |
| G06F 30/333 | (2020.01) |
| G06F 40/166 | (2020.01) |
| G06F 3/0354 | (2013.01) |

(52) U.S. Cl.
CPC ............... *G06F 8/38* (2013.01); *G06F 9/451* (2018.02); *G06F 9/4881* (2013.01); *G06F 15/80* (2013.01); *G06F 16/2228* (2019.01); *G06F 16/951* (2019.01); *G06F 30/20* (2020.01); *G06K 9/6257* (2013.01); *G06N 3/008* (2013.01); *G06N 3/04* (2013.01); *G06N 3/0454* (2013.01); *G06N 3/08* (2013.01); *G06N 3/105* (2013.01); *G06N 5/04* (2013.01); *G06Q 10/00* (2013.01); *H04L 67/42* (2013.01); *G06F 3/03543* (2013.01); *G06F 30/333* (2020.01); *G06F 40/166* (2020.01)

(58) Field of Classification Search
CPC ..... G06F 9/4881; G06F 15/80; G06N 3/0454; G06N 3/08; G06N 20/00
See application file for complete search history.

(56) References Cited

U.S. PATENT DOCUMENTS

| | | | |
|---|---|---|---|
| 7,386,522 B1 | 6/2008 | Bigus et al. | |
| 8,442,839 B2 | 5/2013 | Yen et al. | |
| 8,521,664 B1 | 8/2013 | Lin et al. | |
| 9,443,192 B1* | 9/2016 | Cosic | G06N 3/02 |
| 9,460,088 B1 | 10/2016 | Sak et al. | |
| 9,524,461 B1 | 12/2016 | Huynh | |
| 9,558,454 B2 | 1/2017 | Strassner | |
| 10,586,173 B2 | 3/2020 | Hammond et al. | |
| 10,800,040 B1 | 10/2020 | Beckman et al. | |
| 10,990,894 B2 | 4/2021 | Shaashua et al. | |
| 2003/0004672 A1 | 1/2003 | Thurman | |
| 2003/0204311 A1 | 10/2003 | Bush | |
| 2004/0122788 A1 | 6/2004 | Griffith et al. | |
| 2004/0255291 A1 | 12/2004 | Sierer et al. | |
| 2005/0034109 A1 | 2/2005 | Hamilton et al. | |
| 2005/0114280 A1 | 5/2005 | Rising, III | |
| 2005/0132032 A1 | 6/2005 | Bertrand | |
| 2005/0197991 A1 | 9/2005 | Wray et al. | |
| 2006/0166174 A1 | 7/2006 | Rowe et al. | |
| 2006/0218107 A1 | 9/2006 | Young | |
| 2009/0106165 A1 | 4/2009 | Solomon | |
| 2009/0106178 A1 | 4/2009 | Chu | |
| 2009/0119587 A1 | 5/2009 | Allen et al. | |
| 2009/0204563 A1 | 8/2009 | Gerber et al. | |
| 2010/0088258 A1 | 4/2010 | Oaten et al. | |
| 2010/0094790 A1 | 4/2010 | Gnojewski | |
| 2010/0106714 A1 | 4/2010 | Lim et al. | |
| 2012/0159090 A1 | 6/2012 | Andrews et al. | |
| 2012/0209794 A1 | 8/2012 | Jones, III | |
| 2012/0239598 A1 | 9/2012 | Cascaval et al. | |
| 2015/0066929 A1 | 3/2015 | Satzke et al. | |
| 2015/0339570 A1 | 11/2015 | Scheffler | |
| 2016/0034809 A1 | 2/2016 | Trenholm et al. | |
| 2016/0283202 A1 | 9/2016 | Sellers-blais | |
| 2016/0358098 A1 | 12/2016 | Duesterwald et al. | |
| 2017/0061283 A1 | 3/2017 | Rasmussen et al. | |
| 2017/0091670 A1* | 3/2017 | Gulin | G06N 20/00 |
| 2017/0193361 A1 | 7/2017 | Chilimbi et al. | |
| 2017/0213126 A1 | 7/2017 | Hammond et al. | |
| 2017/0213131 A1 | 7/2017 | Hammond et al. | |
| 2017/0213132 A1 | 7/2017 | Hammond et al. | |
| 2017/0213154 A1 | 7/2017 | Hammond et al. | |
| 2017/0213155 A1 | 7/2017 | Hammond et al. | |
| 2017/0213156 A1 | 7/2017 | Hammond et al. | |
| 2017/0262769 A1 | 9/2017 | Mcshane et al. | |
| 2017/0308800 A1 | 10/2017 | Cichon et al. | |
| 2018/0060759 A1 | 3/2018 | Chu et al. | |
| 2018/0191867 A1 | 7/2018 | Siebel et al. | |
| 2018/0240062 A1 | 8/2018 | Crabtree et al. | |
| 2018/0293463 A1 | 10/2018 | Brown | |
| 2018/0293493 A1 | 10/2018 | Kalamkar et al. | |
| 2018/0293498 A1 | 10/2018 | Campos et al. | |
| 2018/0293517 A1 | 10/2018 | Browne et al. | |
| 2018/0307945 A1 | 10/2018 | Haigh et al. | |
| 2018/0357047 A1 | 12/2018 | Brown et al. | |
| 2018/0357152 A1 | 12/2018 | Browne et al. | |
| 2018/0357543 A1 | 12/2018 | Brown et al. | |
| 2018/0357552 A1 | 12/2018 | Campos et al. | |

FOREIGN PATENT DOCUMENTS

| | | |
|---|---|---|
| CN | 102222005 A | 10/2011 |
| CN | 102591654 A | 7/2012 |
| CN | 102707982 A | 10/2012 |
| CN | 104106276 A | 10/2014 |
| CN | 105068661 A | 11/2015 |
| WO | WO 2015/017706 | 2/2015 |

OTHER PUBLICATIONS

Gudimella, et al., "Deep Reinforcement Learning for Dexterous Manipulation With Concept Networks", Retrieved From: https://arxiv.org/pdf/1709.06977.pdf, Sep. 20, 2017, 16 Pages.

Hengst, Bernhard, "Safe State Abstraction and Reusable Continuing Subtasks in Hierarchical Reinforcement Learning", In Proceedings of 20th Joint Conference on Artificial Intelligence, Dec. 2, 2007, 11 Pages.

"International Search Report & Written Opinion Issued in PCT Application No. PCT/US2018/037650", dated Aug. 31, 2018, 10 Pages.

"Non-Final Office Action Issued in U.S. Appl. No. 15/416,904", dated Aug. 14, 2019, 11 Pages.

"Notice of Allowance Issued in U.S. Appl. No. 15/417,075", dated Aug. 14, 2019, 9 Pages.

"Extended Search Report Issued in European Patent Application No. 17745025.1", dated Aug. 23, 2019, 9 Pages.

"Extended Search Report Issued in European Patent Application No. 17745016.0", dated Aug. 20, 2019, 8 Pages.

"Extended Search Report Issued in European Patent Application No. 17745030.1", dated Sep. 2, 2019, 7 Pages.

Cross-Reference to Related Applications Under 37 C.F.R. 1.78, 2 pages.

Bonsai AI, Inc. Services Overview, 3 pages.

Chung, Kiuk, "Generating Recommendations at Amazon Scale with Apache Spark and Amazon DSSTNE", AWS Big Data Blog, Jul. 9, 2016, 10 pages.

(56) References Cited

OTHER PUBLICATIONS

Dunn, Jeffrey, "Introducing FBLearner Flow: Facebook's AI backbone", Engineering Blog, Facebook Code, Dec. 20, 2016, 11 pages.
Gray, Kathryn E., "Towards Customizable Pedagogic Programming Languages", dissertation submitted to the School of Computing at the University of Utah, Aug. 2006, 156 pages.
Hammond, Mark et al. "AI for Everyone: An Introduction to Bonsai BRAIN and Inkling" Bonsai AI, Inc. Whitepaper, 2016, 16 pages.
He, Jinru, "Auto scaling Pinterest" Pinterest Engineering Blog, Sep. 16, 2016, 7 pages.
Ma, Kevin, "Applying deep learning to Related Pins" Pinterest Engineering Blog, Jan. 12, 2017, 8 pages.
Raschka, Sebastian, "Fitting a model via closed-form equations vs. Gradient Descent vs Stochastic Gradient Descent vs Mini-Batch Learning. What is the difference?" Machine Learning FAQ, Jan. 17, 2017, 6 pgs.
SuperUser.Com, "What's the difference between an Application, Process, and Services?" Jan. 20, 2017, 1 page.
Tessler, Chen et al., "A Deep Hierarchical Approach to Lifelong Learning in Minecraft" Technion Israel Institute of Technology, Nov. 30, 2016, 10 pages.
www.docker, "Build, Ship, Run Any App, Anywhere", https://dockercon.smarteventscloud.com/portal/newreg.ww DockerCon 2017, 7 pages.
International Search Report and Written Opinion for International Application PCT/US2017/015446 dated Apr. 10, 2017, 6 pages.
International Search Report and Written Opinion for International Application PCT/US2017/015460 dated May 5, 2017, 11 pages.
International Search Report and Written Opinion for International Application PCT/US2017/015470 dated Apr. 21, 2017, 11 pages.
"Non Final Office Action Issued in U.S. Appl. No. 15/416,988", dated Oct. 3, 2019, 11 Pages.
"Non Final Office Action Issued in U.S. Appl. No. 15/417,056", dated Oct. 17, 2019, 10 Pages.
"Non Final Office Action Issued in U.S. Appl. No. 15/417,086", dated Nov. 7, 2019, 13 Pages.
Beale, et al., "Neural Network Toolbox 7 User's Guide", Retrieved from http://citeseerx.ist.psu.edu/viewdoc/download?doi=10.1.1.220.1640&rep=rep1&type=pdf, 2010, 951 Pages.
"Non Final Office Action Issued in U.S. Appl. No. 15/417,033", dated Nov. 26, 2019, 13 Pages.
"Final Office Action Issued in U.S. Appl. No. 15/417,086", dated Feb. 25, 2020, 18 Pages.
"Office Action Issued in European Patent Application No. 17745016.0", dated Jul. 13, 2020, 9 Pages.
Lirov, Yuval, "Computer Aided Neural Network Engineering", In the Journal of Neural Networks, vol. 5, Issue 4, Jul. 1992, pp. 711-719.
Perera, et al., "ANNEbot: An Evolutionary Artificial Neural Network Framework", In the Proceedings of 4th International Conference on Intelligent and Advanced Systems, Jun. 12, 2012, pp. 40-45.
"Summons to Attend Oral Proceedings Issued in European Patent Application No. 17745016.0", dated Oct. 23, 2020, 7 Pages.
Ciancio, et al., "Heuristic techniques to optimize neural network architecture in manufacturing applications", In Journal of Neural Computing and Applications, vol. 27, Issue 7, Jul. 31, 2015, pp. 2001-2015.
"Non Final Office Action Issued in U.S. Appl. No. 16/008,751", dated Dec. 1, 2020, 26 Pages.
Luchian, et al., "Automation of the Infrastructure and Services for an OpenStack Deployment using Chef Tool", In IEEE 15th RoEduNet Conference: Networking in Education and Research, Sep. 7, 2016, 5 Pages.
"Non Final Office Action Issued in U.S. Appl. No. 16/009,039", dated Dec. 14, 2020, 32 Pages.
"Office Action and Search Report Issued in Chinese Patent Application No. 201780020322.4", dated Apr. 2, 2021, 7 Pages.
Arendt, et al., "A Tool Environment for Quality Assurance based on the Eclipse Modeling Framework", In Journal of Automated Software Engineering, vol. 20, Issue 2, Dec. 11, 2012, pp. 141-184.
Yang, et al., "Intelligent Search Engine Based on Knowledge Library", In Journal of Computer and Information Technology, vol. 18, Issue 2, Apr. 30, 2010, pp. 41-44.
"First Office Action and Search Report Issued in Chinese Patent Application No. 201780020323.9", dated May 24, 2021, 21 Pages.
"Notice of Allowance Issued in U.S. Appl. No. 16/009,153", dated Jul. 1, 2021, 11 Pages.

\* cited by examiner

Create New BRAIN

BRAIN Name bonsaiuser/ [Project name, e.g., "Breakout"]

Description

[Enter a brief description of your BRAIN]

GitHub link (optional)

[GitHub link to store the code your BRAIN will execute]

[Create BRAIN]

FIG. 6A

ⓧ ⊖ ▢  user@computer: ~

$ bonsai brain create Breakout

FIG. 6B

ARTIFICIAL INTELLIGENCE ENGINE HOSTED ON AN ONLINE PLATFORM

CROSS-REFERENCE

This application claims priority to U.S. Provisional Patent Application No. U.S. 62/287,861, filed Jan. 27, 2016, titled "BONSAI PLATFORM, LANGUAGE, AND TOOLING," the disclosure of which is hereby incorporated herein by reference in its entirety.

NOTICE OF COPYRIGHT

A portion of this disclosure contains material that is subject to copyright protection. The copyright owner has no objection to the facsimile reproduction by anyone of the material subject to copyright protection as it appears in the United States Patent & Trademark Office's patent file or records, but otherwise reserves all copyright rights whatsoever.

FIELD

Embodiments of the design provided herein generally relate to artificial intelligence systems and methods thereof.

BACKGROUND

Artificial intelligence ("AI") has potential to be one of the most impactful technologies of the $21^{st}$ century and beyond. Unfortunately, software developers currently looking to work with AI must learn complex toolkits, use limited application programming interfaces ("APIs"), use constrained black-box solutions for AI, or some combination thereof. The foregoing limitations must be overcome for software developers and enterprises to solve real-world problems with AI. In addition, with fewer than 20,000 data science experts capable of building AI at its lowest levels, working with AI needs to be made more accessible to the 20 million or more software developers of the software development community. Provided herein are AI systems and methods that address the foregoing.

SUMMARY

Provided herein in some embodiments is an AI engine hosted on one or more remote servers configured to cooperate with one or more databases including one or more AI-engine modules and one or more server-side client-server interfaces. The one or more AI-engine modules can include an instructor module and a learner module configured to train an AI model in one or more training cycles. An assembly code can be generated from a source code written in a pedagogical programming language describing a mental model of one or more concept modules to be learned by the AI model and curricula of one or more lessons for training the AI model on the one or more concept modules. Each of the one or more lessons can be configured to optionally use a different flow of the training data. The one or more server-side client-server interfaces can be configured to enable client interactions with the AI engine in one or both client interactions selected from i) submitting the source code for training the AI model and ii) using the trained AI model for one or more predictions. The AI engine can be configured to instantiate the trained AI model based on the one or more concept modules learned by the AI model in the one or more training cycles.

Also provided herein in some embodiments is an AI system including one or more remote servers, one or more databases, and one or more local clients. The one or more remote servers can include an AI engine including one or more AI-engine modules, a compiler, and one or more server-side client-server interfaces configured to enable client interactions with the AI engine. The one or more AI-engine modules can include an instructor module and a learner module configured to train an AI model in one or more training cycles. The compiler can be configured to generate an assembly code from a source code written in a pedagogical programming language describing a mental model of one or more concept modules to be learned by the AI model and curricula of one or more lessons for training the AI model on the one or more concept modules. Each of the one or more lessons can be configured to optionally use a different flow of the training data. The AI engine can be configured to instantiate a trained AI model based on the one or more concept modules learned by the AI model in the one or more training cycles. The one or more local clients can include a coder for generating the source code written in the pedagogical programming language. The one or more local clients can further include one or more client-side client-server interfaces configured to enable client interactions with the AI engine such as submitting the source code for training the AI model and using the trained AI model for one or more predictions. The one or more client-side client-server interfaces can be selected from a command-line interface, a graphical interface, a web-based interface, or a combination thereof. The AI system can further include one or more training data sources configured to provide training data, wherein the one or more training data sources includes at least one server-side training data source or at least one client-side training data source configured to provide the training data.

Also provided herein in some embodiments is a method for the AI engine including enabling client interactions, compiling an assembly code, training an AI model, and instantiating a trained AI model. The client interactions can be enabled in one or more server-side client-server interfaces configured for client interactions with the AI engine such as submitting a source code for training the AI model or using the trained AI model for one or more predictions. The assembly code can be compiled from the source code, wherein a compiler is configured to generate the assembly code from the source code written in a pedagogical programming language. The source code can include a mental model of one or more concept modules to be learned by the AI model using training data. The source code can also include curricula of one or more lessons for training the AI model on the one or more concept modules. Each of the one or more lessons can be configured to optionally use a different flow of the training data. The AI model can be trained by one or more AI-engine modules including an instructor AI-engine module and a learner AI-engine module for training the AI model in one or more training cycles. The trained AI model can be instantiated by the AI engine based on the one or more concept modules learned by the AI model in the one or more training cycles.

These and other features of the design provided herein can be better understood with reference to the drawings, description, and claims, all of which form the disclosure of this patent application.

DRAWINGS

The drawings refer to some embodiments of the design provided herein in which:

FIG. 1A provides a schematic illustrating a simple artificial neural network.

Figure 1B:
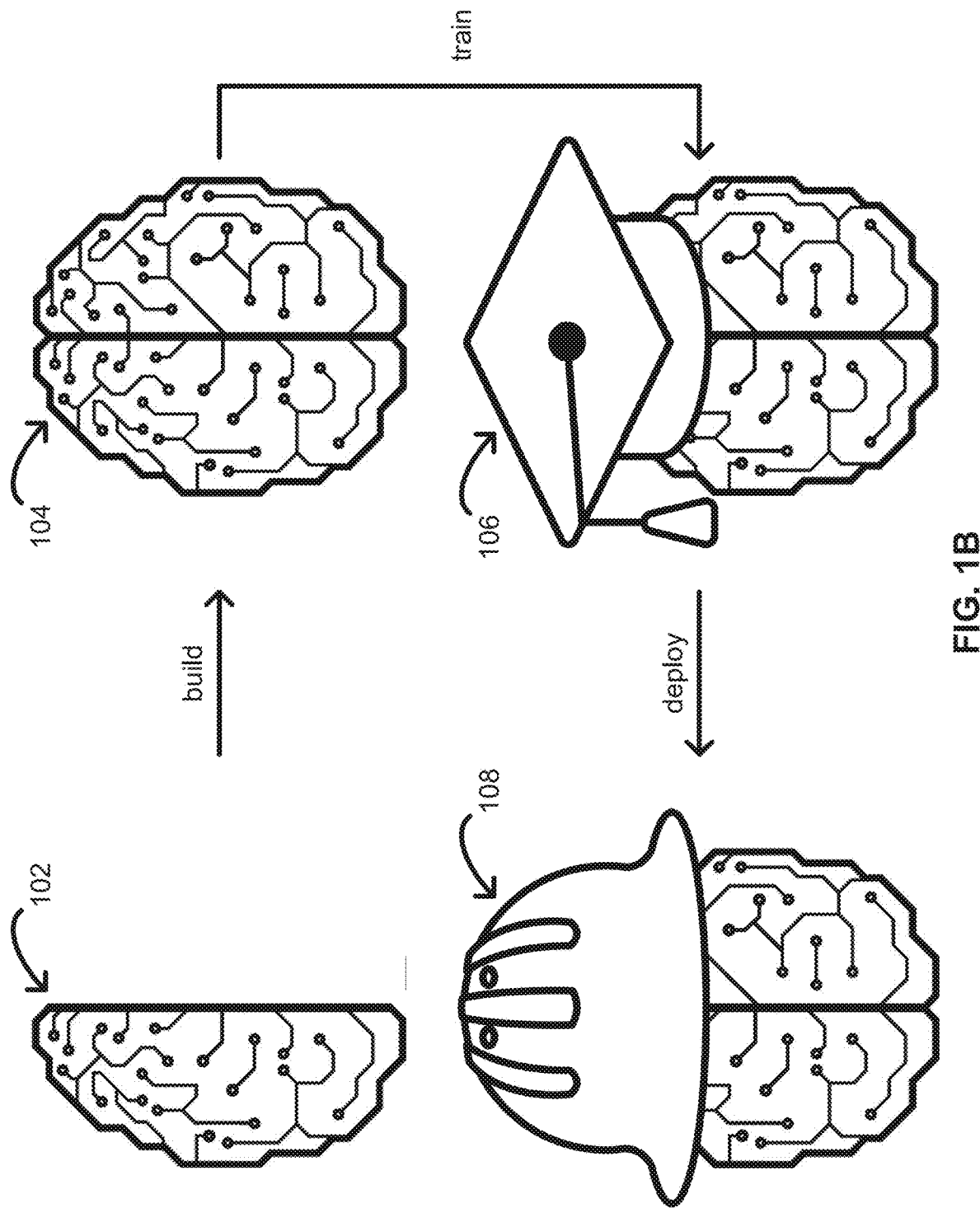

FIG. 1B provides a schematic illustrating building, training, and deploying a trained AI model in accordance with some embodiments.

Figure 2A:
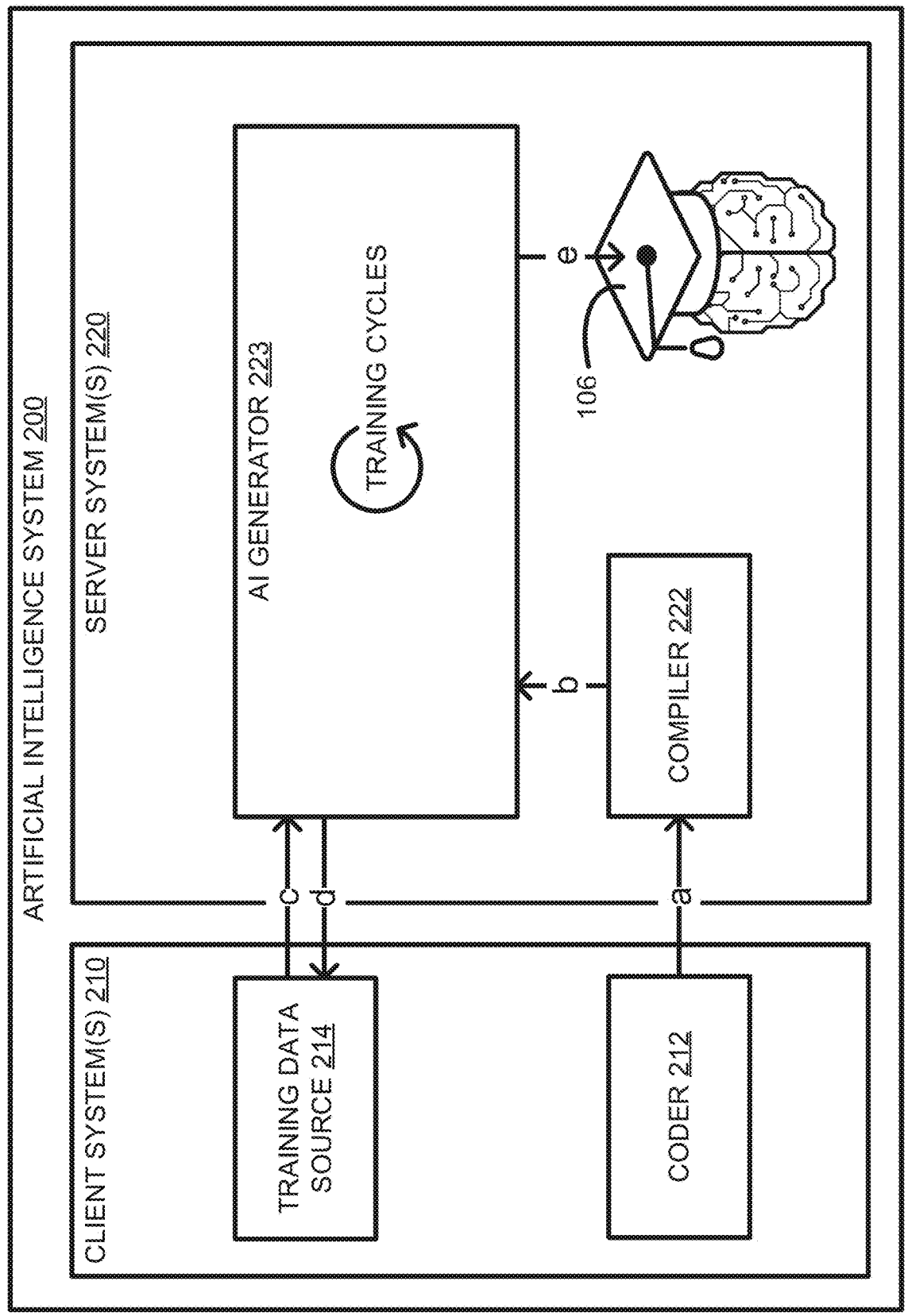

FIG. 2A provides a schematic illustrating an AI system in accordance with some embodiments.

Figure 2B:
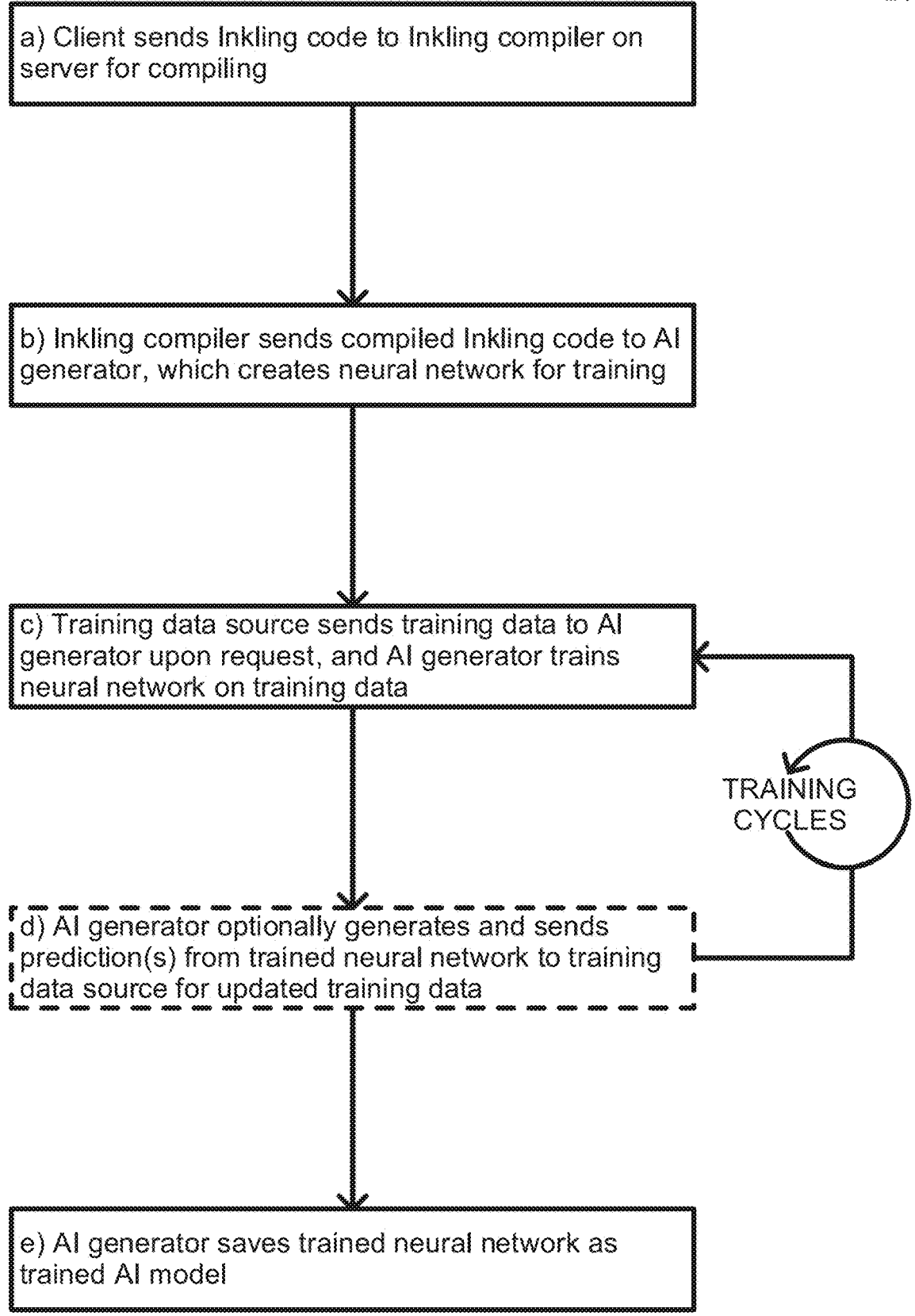

FIG. 2B provides a schematic illustrating a method associated with an AI system in accordance with some embodiments.

Figure 3A:
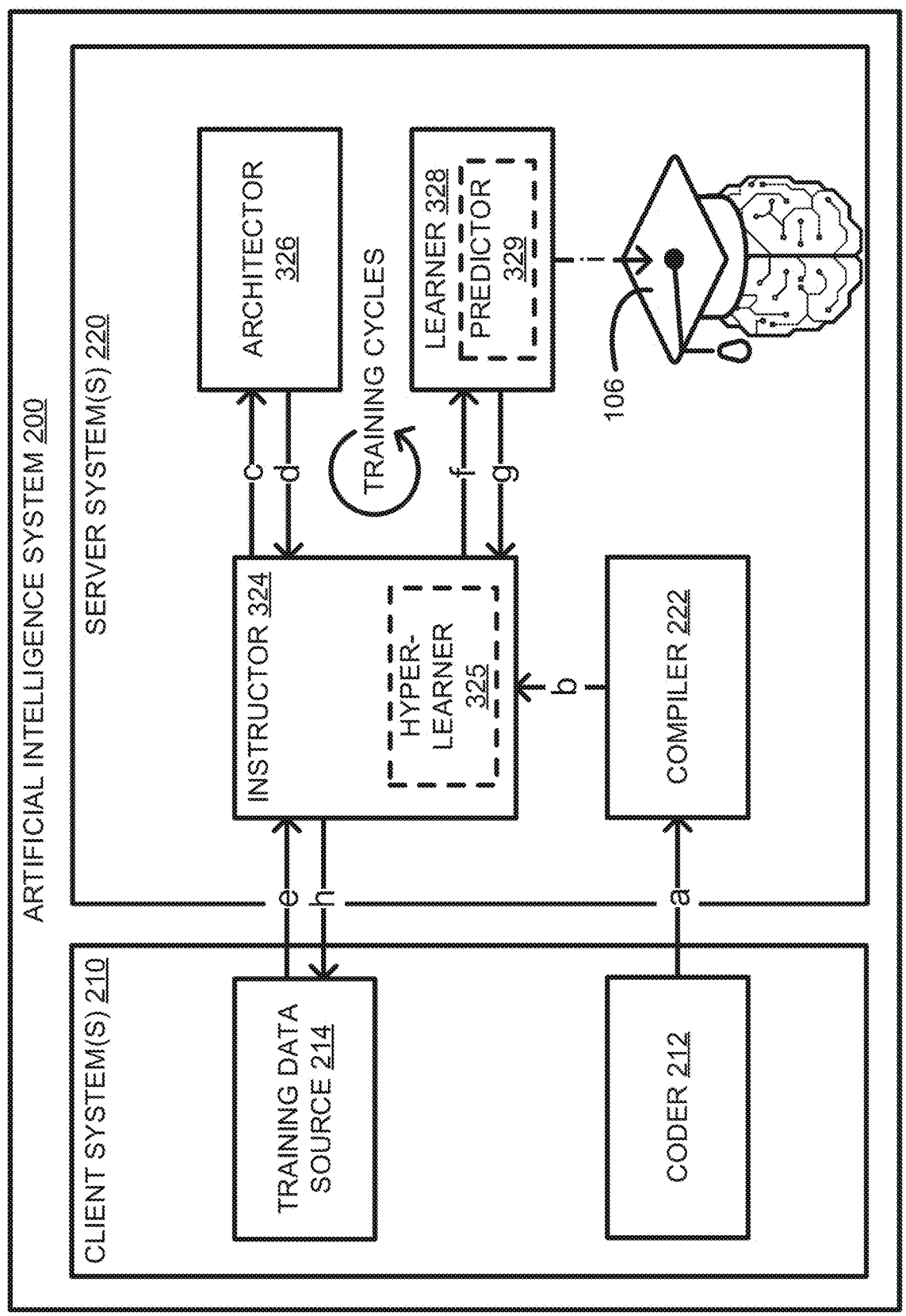

FIG. 3A provides a schematic illustrating an AI system in accordance with some embodiments.

Figure 3B:
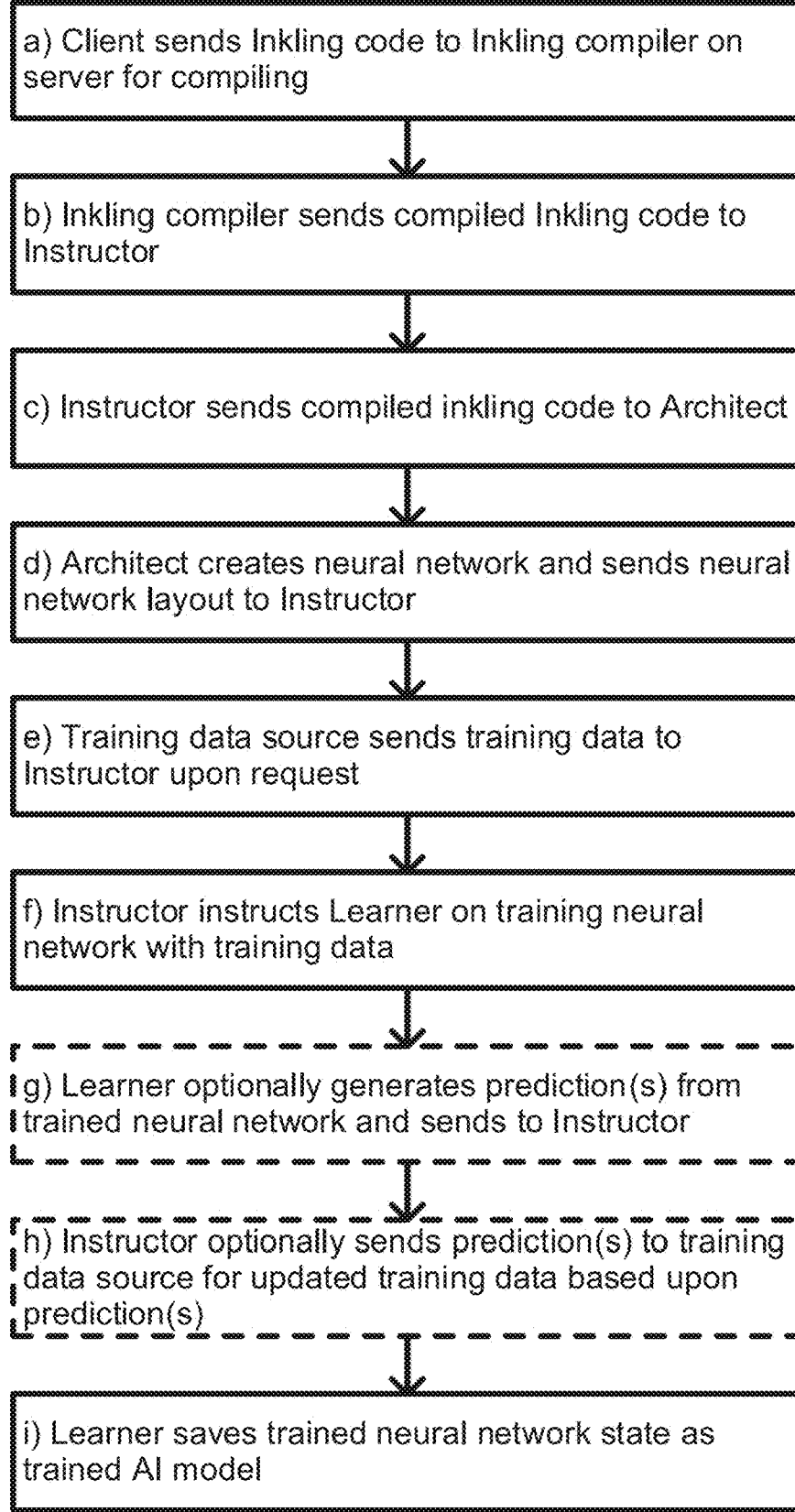

FIG. 3B provides a schematic illustrating a method associated with an AI system in accordance with some embodiments.

Figure 4A:
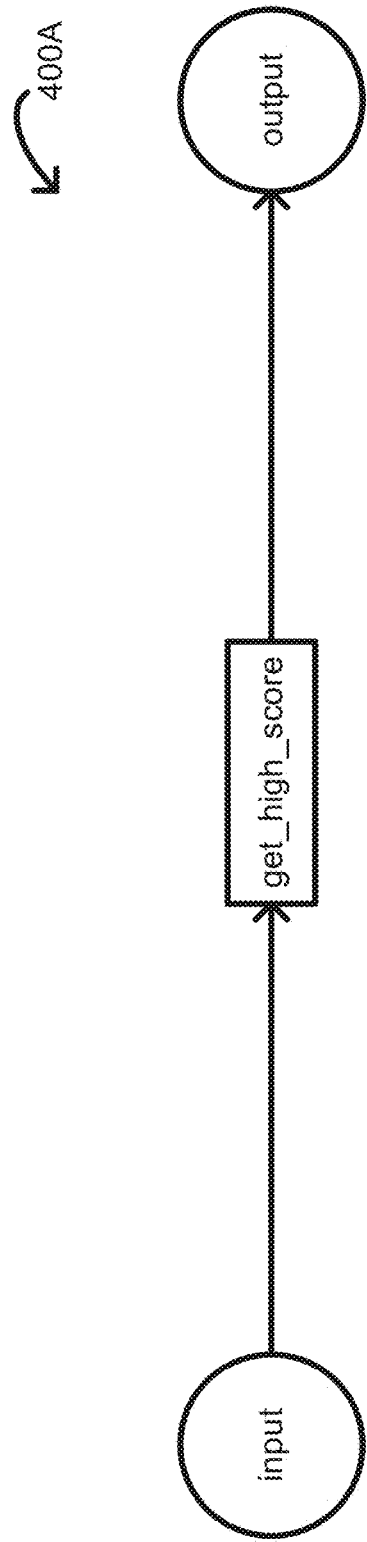

FIG. 4A provides a schematic illustrating a mental model in accordance with some embodiments.

Figure 4B:
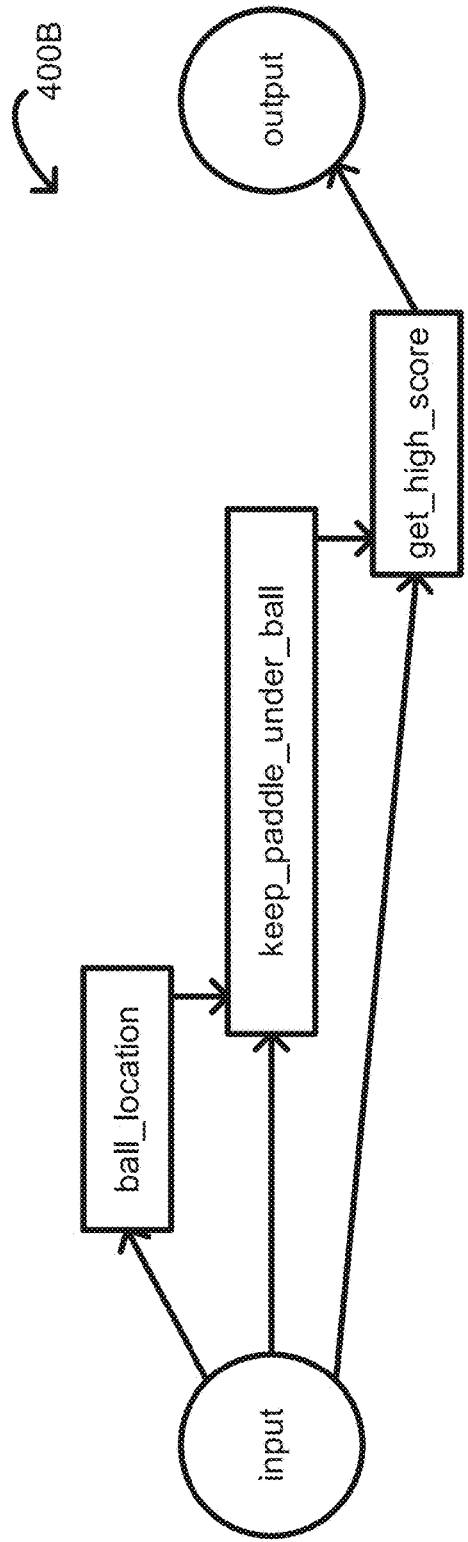

FIG. 4B provides a schematic illustrating a mental model in accordance with some embodiments.

Figure 5:
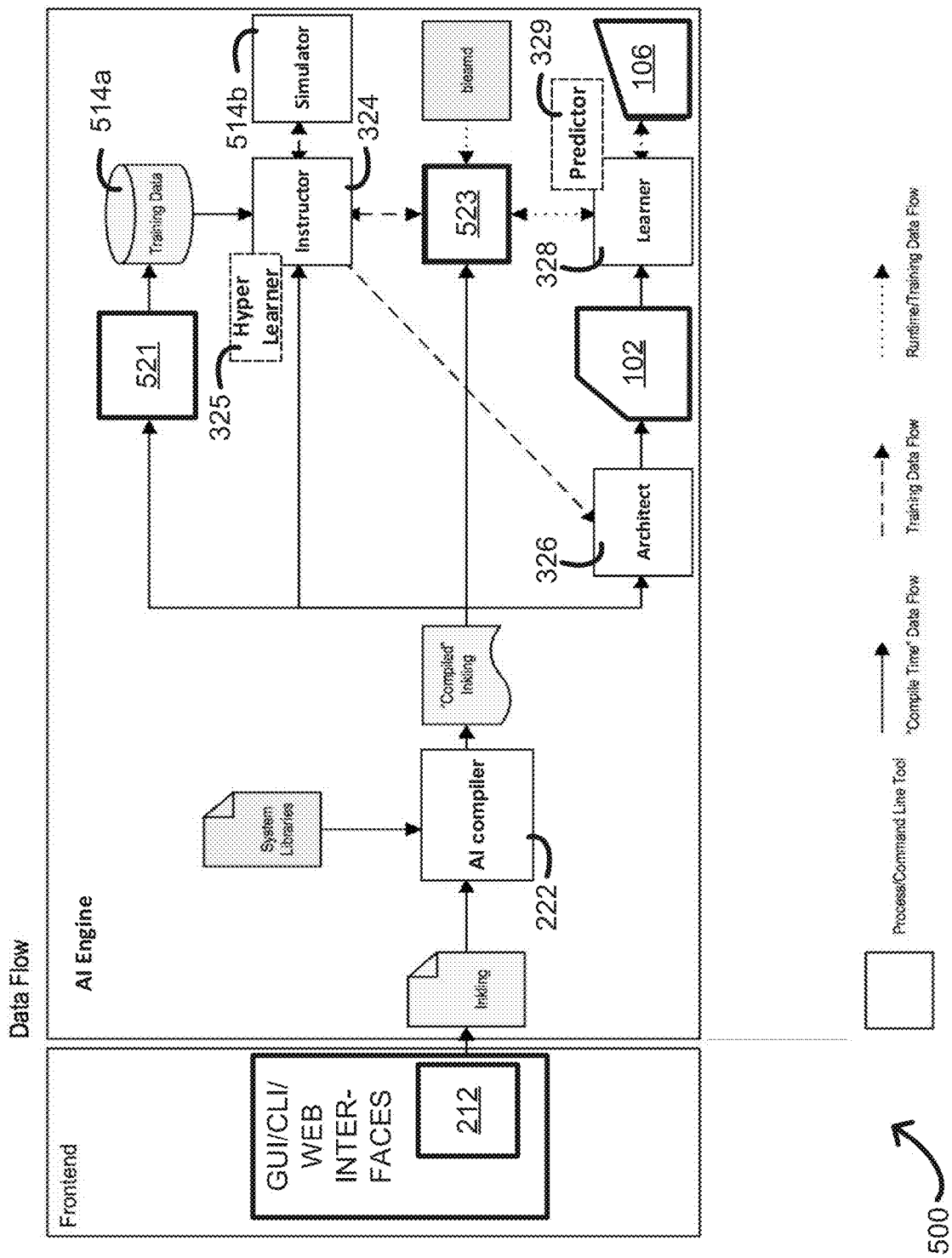

FIG. 5 provides a schematic illustrating an AI system in accordance with some embodiments.

FIG. 6A provides a schematic illustrating a client-side client-server interface in accordance with some embodiments.

FIG. 6B provides a schematic illustrating a client-side client-server interface in accordance with some embodiments.

Figure 7A:
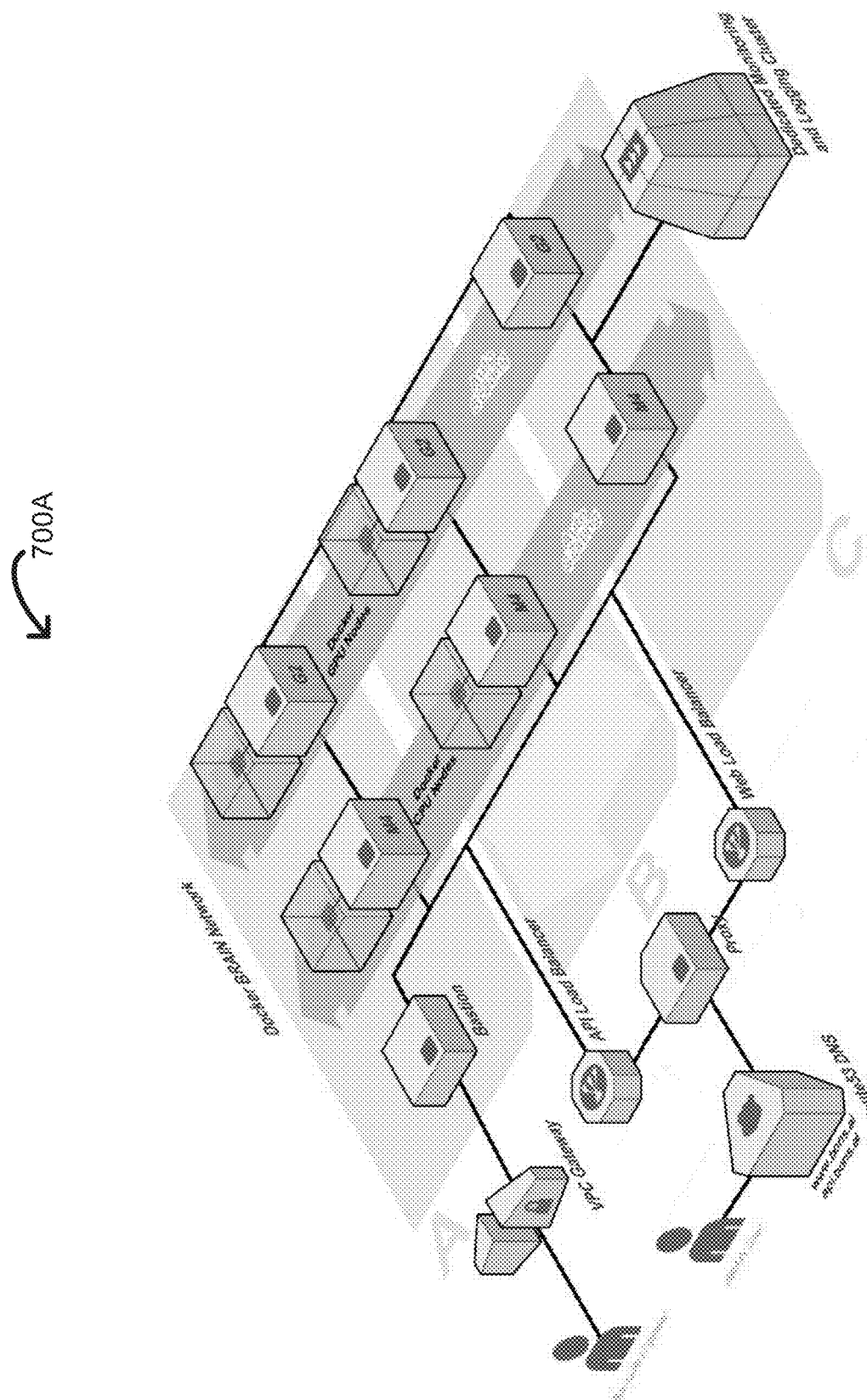

FIG. 7A provides a schematic illustrating an AI system in accordance with some embodiments.

Figure 7B:
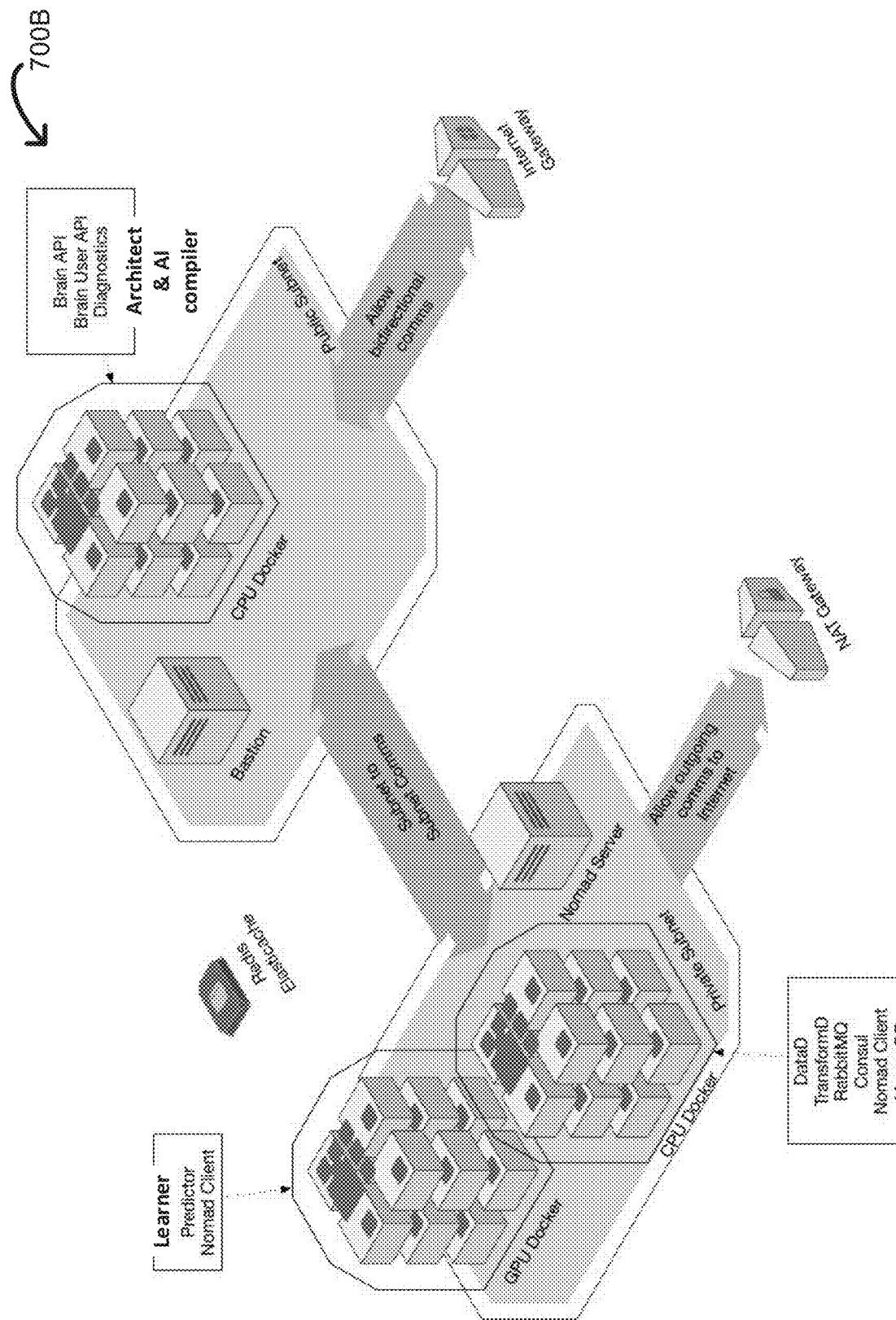

FIG. 7B provides a schematic illustrating an AI system in accordance with some embodiments.

Figure 8:
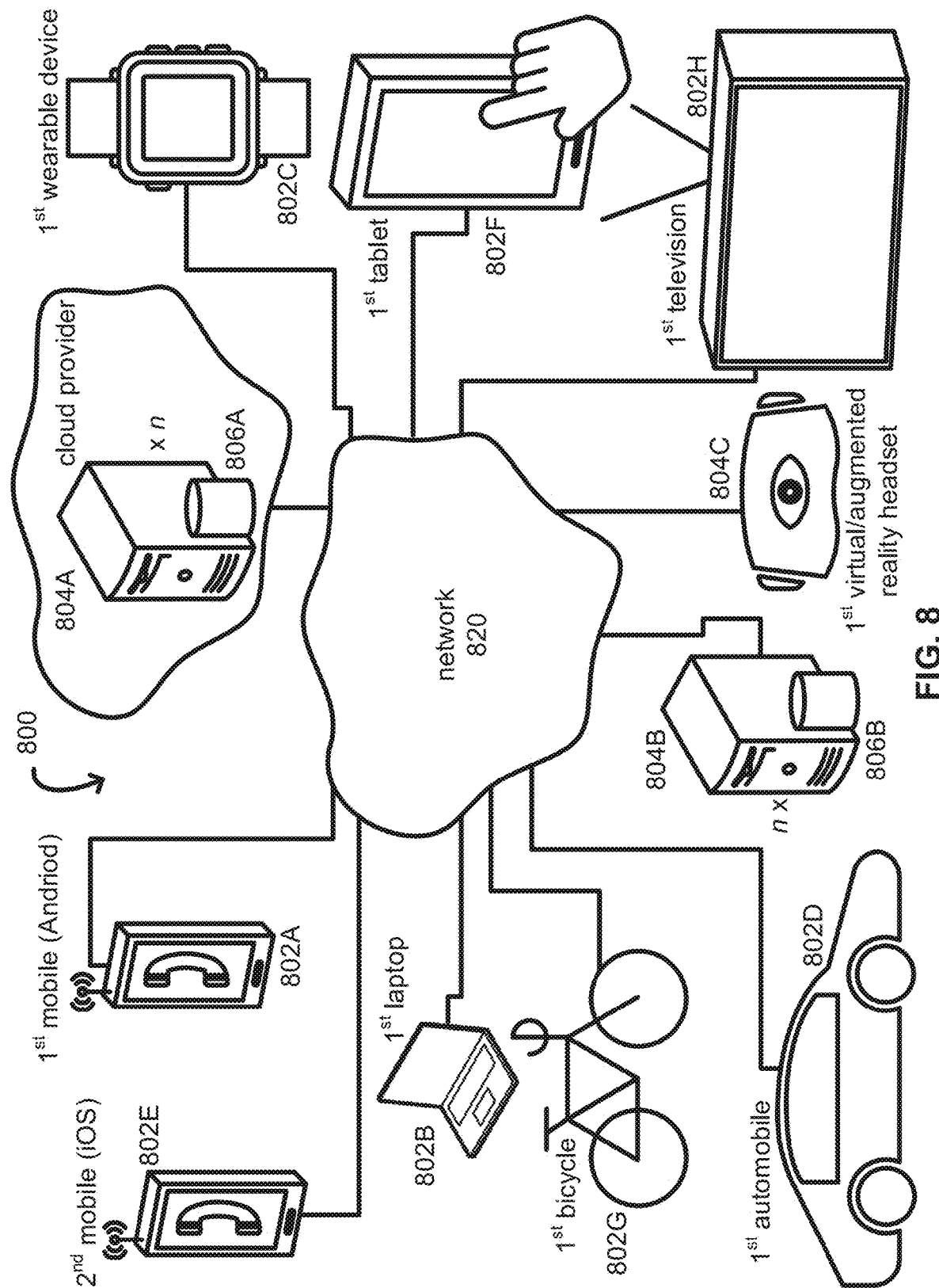

FIG. 8 provides one or more networks in accordance with some embodiments.

Figure 9:
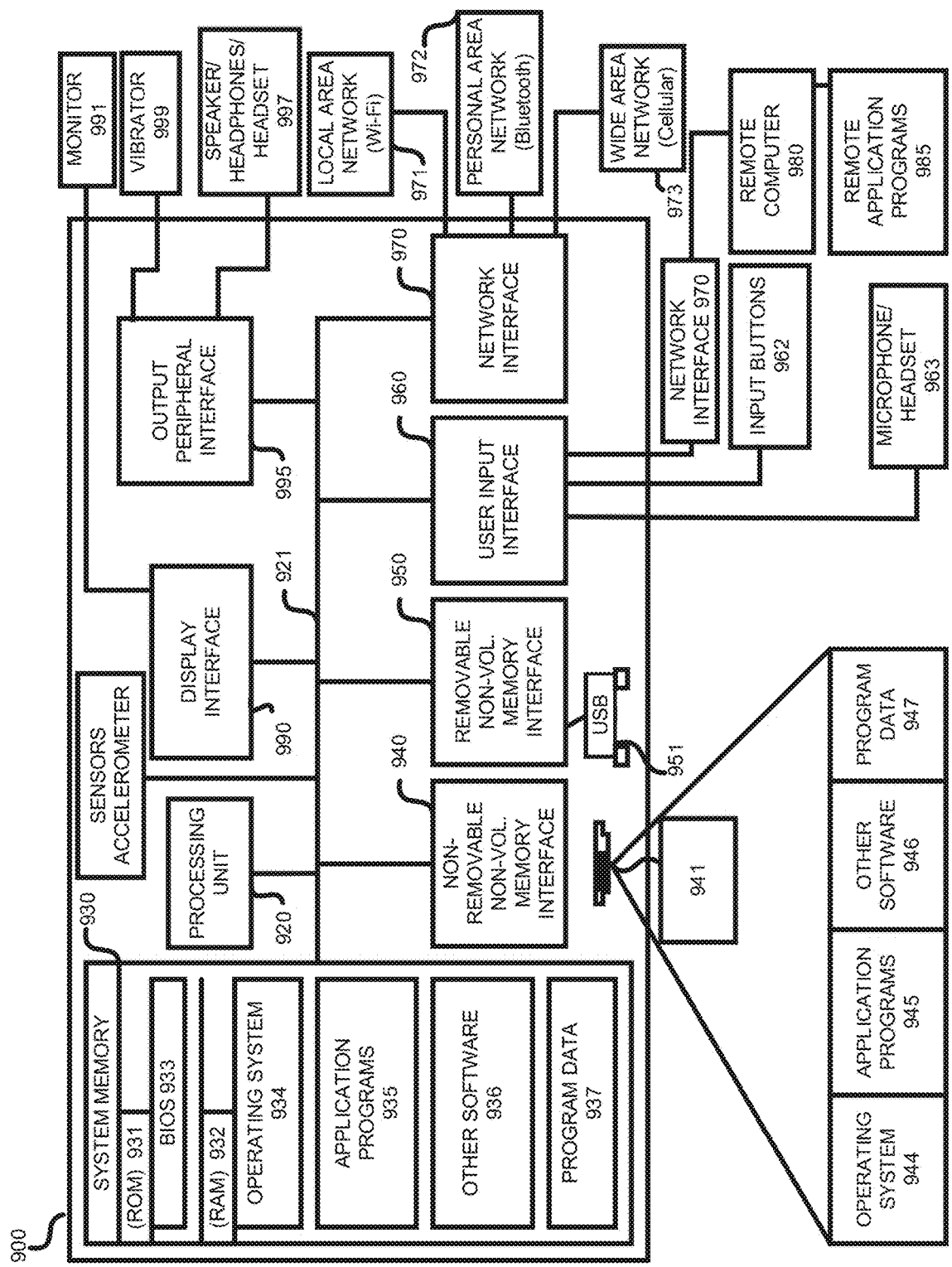

FIG. 9 provides one or more computing systems in accordance with some embodiments.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details are set forth, such as examples of specific data signals, named components, memory in a device, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as first driver, can be made. However, the specific numeric reference should not be interpreted as a literal sequential order but rather interpreted that the first notification is different than a second notification. Thus, the specific details set forth are merely exemplary. The specific details can be varied from and still be contemplated to be within the spirit and scope of the present design. The term coupled is defined as meaning connected either directly to the component or indirectly to the component through another component.

An "AI model" as used herein includes, but is not limited to, neural networks such as recurrent neural networks, recursive neural networks, feed-forward neural networks, convolutional neural networks, deep belief networks, and convolutional deep belief networks; multi-layer perceptrons; self-organizing maps; deep Boltzmann machines; and stacked de-noising auto-encoders.

An "artificial neural network" or simply a "neural network" as used herein can include a highly interconnected network of processing elements, each optionally associated with a local memory. FIG. 1A provides a schematic illustrating a simple artificial neural network 101. The processing elements can be referred to herein as "artificial neural units," "artificial neurons," "neural units," "neurons," "nodes," and the like, while connections between the processing elements can be referred to herein as "synapses," "weights," and the like. A neuron can receive data from an input or one or more other neurons respectively through one or more weighted synapses, process the data, and send processed data to an output or yet one or more other neurons respectively through one or more other weighted synapses. The neural network or one or more neurons thereof can be generated in either hardware, software, or a combination of hardware and software, and the neural network can be subsequently trained.

As used herein, "remote" and "local" such as in a "remote server" and a "local client" are intended to convey, for example, the remote server and local client are telecommunicatively coupled, sometimes over very large geographic distances. As used herein "online" is intended to convey two systems such as the remote server and the local client are telecommunicatively coupled and available for immediate communications between the two systems. As used herein "offline" is intended to convey two systems such as the remote server and the local client are telecommunicatively coupled but at least one of the two systems is not available for immediate communications between the two systems. For example, at least one of the remote server and the local client can be switched off and, therefore, "offline." Alternatively, "offline" can indicate two systems such as the remote server and the local client are not telecommunicatively coupled.

Unless defined otherwise, all technical and scientific terms used herein have the same meaning as commonly understood by persons of ordinary skill in the art.

AI has potential to be one of the most impactful technologies of the $21^{st}$ century and beyond. Unfortunately, software developers currently looking to work with AI must learn complex toolkits, use limited APIs, use constrained black-box solutions for AI, or some combination thereof. The foregoing limitations must be overcome for software developers and enterprises to solve real-world problems with AI. In addition, with fewer than 20,000 data science experts capable of building AI at its lowest levels, working with AI needs to be made more accessible to the 20 million or more software developers of the software development community. Provided herein are AI systems and methods that address the foregoing.

For example, provided herein in some embodiments is an AI engine hosted on one or more remote servers configured to cooperate with one or more databases including one or more AI-engine modules and one or more server-side client-server interfaces. The one or more AI-engine modules can include an instructor module and a learner module configured to train an AI model in one or more training cycles. The assembly code from a source code written in a pedagogical programming language describing a mental model of one or more concept modules to be learned by the AI model and curricula of one or more lessons for training the AI model on the one or more concept modules. Each of the one or more lessons can be configured to optionally use a different flow of the training data. The one or more server-side client-server interfaces can be configured to enable client interactions with the AI engine in one or both client interactions selected from i) submitting the source code for training the AI model and ii) using the trained AI model for one or more predictions. The AI engine can be configured to instantiate the trained AI model based on the one or more concept modules learned by the AI model in the one or more training cycles.

FIG. 1B provides a schematic illustrating building, training, and deploying a trained AI model in accordance with some embodiments.

As shown, AI systems and methods provided herein enable users such as software developers to design an AI model, build the AI model, train the AI model to provide a trained AI model, and deploy the trained AI model as a deployed AI model in any of a number of desired ways. For example, AI systems and methods provided herein enable users such as software developers to design a neural network layout or neural network topology 102, build a neural network 104, train the neural network 104 to provide a trained neural network 106, and deploy the trained neural network 106 as a deployed neural network 108 in any of a number of desired ways. For example, the trained AI model or the trained neural network 106 can be deployed in or used with a software application or a hardware-based system.

FIG. 2A provides a schematic illustrating an AI system 200 in accordance with some embodiments.

As shown, the AI system 200 includes one or more client systems 210 and one or more server systems 220, wherein each server system or any two or more servers systems of the one or more server systems 220 can be referred to herein as an AI engine. The one or more client systems 210 can be local client systems and include a coder 212 or coding means for generating programming code in a pedagogical programming language such as Inkling™. The one or more client systems 210 can further include a training data source 214. While not shown in FIG. 2A, the training data source 214 can alternatively be included in the one or more server systems 220, or the training data source 214 can be include in both the one or more client systems 210 and the one or more server systems 220. The one or more server systems 220 can be remote server systems and include a compiler 222 for the code and an AI generator 223 for generating the trained neural network 106 via one or more training cycles in the AI generator 223.

FIG. 2B provides a schematic illustrating a method 201 associated with an AI system in accordance with some embodiments.

As shown in view of FIG. 2A, a client such as a local client of the one or more clients 210 can send code from the coder 212 or an intermediate agent to the compiler 222 on a server such as a remote server of the one or more server systems 220 for compiling the code into an optimized assembly code for the AI generator 223. The compiler 222 can send the compiled code or assembly code to the AI generator 223, which proposes and builds a neural network such as the neural network 104 for training as determined by features of the code. The AI generator can request training data from the training data source 214, and the training data source 214 can send the training data to the AI generator 223 upon the request. The AI generator 223 can subsequently train the neural network 104 on the training data in one or more training cycles to provide a trained state of the neural network or the trained neural network 106. The AI generator 223 can elicit a prediction from the trained neural network 106 and send the prediction to the training data source 214 for updated training data based upon the prediction and, optionally, additional training cycles. When the one or more training cycles are complete, the AI generator 223 can save the trained state of the neural network as the trained neural network 106.

FIG. 3A provides a schematic illustrating an AI system in accordance with some embodiments.

Following on the AI system 200 of FIG. 2A, the AI generator 223 for generating the trained neural network 106 can include one or more AI-generator modules selected from at least an instructor module 324, an architect module 326, and a learner module 328 as shown. The instructor module 324, the architect module 326, and the learner module 328 can respectively be referred to herein as the Instructor, the Architect, and the Learner. The instructor module 324 can optionally include hyperlearner module 325, which can be referred to herein as the Hyperlearner, and which can be configured to select one or more hyperparameters for any one or more of a neural network configuration, a learning algorithm, a learning optimizer, and the like. Before selecting the one or more hyperparameters, the hyperlearner module 325 can access a database of solution statistics gathered from one or more repositories of previous problems and previously built AI models therefor and take a fingerprint of a sample of available data by using random predictions. The hyperlearner module 325 can optionally be contained in a different AI-generator module such as the architect module 326 or the learner module 328, or the hyperlearner module 325 can be an AI-generator module itself. The learner module 328 can optionally include a predictor module 329, which can be referred to herein as the Predictor, and which can provide one or more predictions for a trained neural network such as the trained neural network 106 hosted in a prediction mode. The predictor module 329 can optionally be contained in a different AI-generator module such as the instructor module 324 or the architect module 326, or the predictor module 329 can be an AI-generator module itself. The AI generator 223 including the foregoing one or more AI-generator modules can be configured to generate the trained neural network 106 from compiled code via one or more training cycles in the AI generator 223.

FIG. 3B provides a schematic illustrating a method associated with an AI system in accordance with some embodiments.

As shown in view of FIG. 3A, a client such as a local client of the one or more clients 210 can send code expressed in a pedagogical programming language from the coder 212 or an intermediate agent to the compiler 222 on a server such as remote server of the one or more server systems 220 for compiling the code into an optimized assembly code. The compiler 222 can send the compiled code or assembly code to the instructor module 324, which, in turn, can send the code to the architect module 326. The architect module 326 can propose a neural network layout such as the neural network layout 102—as well as optimize the neural network layout 102—for building and training as determined by features of the code, and the architect module 326 can send the neural network layout 102 to the instructor module 324. In addition, the architect module 326 can map between concepts in a pedagogical programming language and layers of the neural network layout 102 and send one or more maps to the learner module 328. The learner module 328 can build a neural network such as the neural network 104 from the neural network layout 104 specified by the architect module 326. The instructor module 324 can request training data from the training data source 214, and the training data source 214 can send the training data to the instructor module 324 upon the request. The instructor module 324 can subsequently instruct the learner module 328 on training the neural network 104 (e.g., which lessons should be taught in which order) with curricula in the pedagogical programming language for training the concepts, the training data, and one or more hyperparameters from the hyperlearner module 325. Training the neural network 104 can take place in one or more training cycles to yield a trained state of the neural network or the trained neural network 106. The instructor module 324 can decide what concepts and streams should be actively trained in a mental model expressed in the pedagogical programming language, as well as terminating conditions for training the concepts. The learner module 328 or the predictor module 329 can elicit a prediction from the trained neural network 106 and send the prediction to the instructor module 324. The instructor module 324, in turn, can send the prediction to the training data source 214 for updated training data based upon the prediction and, optionally, instruct the learner module 328 in additional training cycles. When the one or more training cycles are complete, the learner module 328 can save the trained state of the neural network as the trained neural network 106.

FIGS. 4A and 4B provide schematics respectively illustrating mental models 400A and 400B in accordance with some embodiments.

The pedagogical programming language Inkling™ is a special purpose programming language designed to effect a trained AI model using higher-level mental models and concepts to be taught instead of lower-level mechanics of a system capable of learning them.

A concept or concept module in a pedagogical programming language can be a software object and/or something that an AI model can be trained on and learn. A concept can fall into one of at least two groups: fact and strategy. A fact-type concept can describe a state of one or more things such as an object, a ball, a character, an enemy, a light, a person, or the like. The state can be whether the one or more things are on or off, hot or cold, a number or a letter, or the like. The fact-type concept can also describe a location. A strategy-type concept can reflect a method or a behavior such as "avoid ghosts," "keep the paddle under the ball," "don't run into walls," "turn lights off," "get high score," or the like. Both FIGS. 4A and 4B show mental models including the strategy-type concept "get high score."

A mental model in pedagogical programming language is also something that an AI model can be trained on and learn. A mental model can include one or more concepts structured (e.g., hierarchically, cyclically, etc.) in terms of the one or more concepts, and the mental model can further include one or more data transformation streams. As shown in FIG. 4A, a single-concept mental model can include, for example, a strategy-type concept such as "get high score." As shown in FIG. 4B, a multi-concept mental model can include a hierarchical structure including, for example, strategy-type concepts such as "keep paddle under ball" and "get high score" and state-type concepts such as "ball location." A concept in a multi-concept mental model can receive input from other concepts in the mental model, send output to other concepts in the mental model, provide a final output or result output, or a combination thereof. Addition of more concepts to a mental model can decrease training time for an AI model, as well as enable a trained AI model to give smarter, more accurate predictions.

Other features of the AI systems and methods provided herein can be better understood with reference to the following:

Foundational Primitives

AI systems and methods provided herein enable a teaching-oriented approach by providing a set of foundational primitives that can be used to represent AI without specifying how the AI is created. These foundational primitives are 1) concepts and mental models, 2) curricula and lessons, and 3) training-data sources, as described in further detail herein.

Concepts and Mental Models

A concept is something that can be learned. Once learned it can provide intelligent output. Concepts can receive input data from other concepts and training-data sources (e.g., simulators), and send output data to other concepts or a final result. A concept can be used in isolation, but it is typically more useful to construct a hierarchy of related concepts, beginning with relatively simple concepts and building to more complex concepts.

The term "mental model" can be used to describe a set of structured concepts. Alternatively, the collection of concepts and their interrelation that models the problem domain can be referred to as the mental model. Given this choice of mental model frames, one can then codify the underlying concepts and their relationships.

Curricula and Lessons

A curriculum is used to teach a concept. To do this, the user needs to provide data to train the concept and tell the AI engine whether the system's understanding of the concept is correct or not. This is analogous to a teacher assigning readings from a book to a student and subsequently testing the student on the contents of the book. The ways in which this data is presented is broken into individual components termed "lessons." In the book analogy, lessons could be individual chapters in the book. Lessons allow the concept to learn bit-by-bit, rather than all at once.

Pedagogical programming focuses on codifying two main pillars: 1) What are the concepts associated with a problem domain, and how do the concepts relate to each other? 2) How can one go about teaching those concepts?

AI Engine

The AI system 500 enables developers to more efficiently build, teach, and use intelligence models.

The AI engine takes in a description of a problem and how one would go about teaching concepts covering aspects of the problem to be solved, and the AI engine compiles the coded description into lower-level structured data objects that a machine can more readily understand, builds a network topology of the main problem concept and sub-concepts covering aspects of the problem to be solved, trains codified instantiations of the sub-concepts and main concept, and executes a trained AI model containing one, two, or more neural networks.

The AI engine can abstract away and automate the low-level mechanics of AI, and the AI engine can manage and automate much of the lower level complexities of working with AI. Each program developed in a pedagogical programming language can be fed into the AI engine in order to generate and train appropriate intelligence models, which can be referred to as Basic Recurrent Artificial Intelligence Networks ("BRAINs") herein. At its heart, a BRAIN can be a topology or a basic network of intelligent processing nodes that comprise a potentially recurrent network, hence the acronym "BRAIN."

The AI engine can abstract generation of a neural network topology for an optimal solution and faster training time with a curriculum and lessons to teach the neural network via recursive simulations and training sessions on each node making up the neural network.

The AI engine can contain a vast array of machine learning algorithms for various AI models, has logic for picking learning algorithms and guiding training, manages data streaming and data storage, and provides the efficient allocation of hardware resources. The AI engine can be built with an infrastructure that supports streaming data efficiently through the system, and the AI engine can use a set of heuristics to make choices about which learning algorithms to use to train each BRAIN. The set of heuristics also make it possible for the AI engine to choose from any number of possible algorithms, topologies, etc., train a number of BRAINs in parallel, and pick the best result.

The AI engine can be a cloud-hosted platform-as-a-service configured to manage complexities inherent to training AI networks. Thus, the AI engine can be accessible with one or more client-side interfaces to allow third parties to submit a description of a problem in a pedagogical programming language and let the online AI engine build and generate a trained intelligence model for one or more of the third parties.

Major Components

FIG. 5 provides a schematic illustrating an AI system 500 including an AI engine in accordance with some embodiments.

The details for any given implementation of a BRAIN server may vary substantially, but many have common architectural components such as the following six components: 1) an architect module, 2) an instructor module, 3) a learner module, 4) a compiler, 5) a hyperlearner module, and 6) one or more interfaces exchanging communications into and out of the AI engine.

Following on the AI system 200 of FIGS. 2A and 3A, the AI system 500 includes the coder 212 on the one or more client systems (e.g., local client systems) and the following on the one or more server systems (e.g., remote server systems): the compiler 222; the AI-generator modules including the instructor module 324, the architect module 326, and the learner module 328, the hyperlearner module 325, and the predictor module 329. In addition to the foregoing, the AI system 500 can include a training data loader 521 configured to load training data, a training data database 514a, a simulator 514b, and a streaming data server 523. The training data can be batched training data, streamed training data, or a combination thereof, and a training data manager can be configured to push or pull the training data from one or more training data sources selected from a simulator, a training data generator, a training data database, or a combination thereof. A batch data source can supply batched data from a database in at least one embodiment. A random-data generator can generate random data based on user-input parameters. Further in addition to the foregoing, FIG. 5 shows the architect module 326 configured to propose a neural network layout such as the neural network layout 102 and the learner module 328 configured to save a trained state of a neural network such as the trained neural network 106.

Client-Server Interfaces

The AI system provided herein can include one or more client-server interfaces selected from at least a command-line interface, a graphical interface, a web-based interface, or a combination thereof. Each of the client-server interfaces includes a client-side client-server interface and a server-side client-server interface configured to cooperate or communicate with each other such that a user on a local client can work online with a remote server including the AI engine. As such, one or more server-side client-server interfaces are configured to respectively cooperate with one or more client-side client-server interfaces and vice versa. In a first example of a client-server interface, namely a web-based interface, a client-side web-based interface (e.g., a web browser-based application used in a textual or graphical user environment) is configured to cooperate with a server-side web-based interface. In a second example of a client-server interface, namely a command-line interface, a client-side command-line interface (e.g., a command line-based application used in a shell such as Bash) is configured to cooperate with a server-side command-line interface.

Graphical or Web-Based Interface

FIG. 6A provides a schematic illustrating client-side client-server interface 600A in accordance with some embodiments.

A graphical interface can include web-based interface or a non-web-based interface accessed through a native client application other than a web browser such as an integrated development environment. As shown, the graphical interface 600A is configured to request information for creating a new BRAIN such as a name for the new BRAIN, a description for the new BRAIN, and a link to store code the new BRAIN is to execute.

With respect to a web-based interface, the graphical interface 600A can represent an open tab or a portion thereof in a browser, a pop-up window of the browser, a pop-under window of the browser, a plugin element of the browser, or any other browser element configured to request and accept input. The web-based interface can include a browser-based tool configured to access a web site for configuring and analyzing BRAINs stored in the AI engine. The web site can be used for sharing, collaborating, and learning. Some information that can be accessed from the web site is a visualization of a BRAIN's training progress.

With respect to a non-web-based interface, the graphical interface 600A can likewise represent an open tab or a portion thereof, a pop-up window, a pop-under window, a plugin element, or any other element configured to request and accept input such as a dialog box, wherein the graphical interface 600A is the native client application other than the web browser.

Command Line Interface ("CLI")

FIG. 6B provides a schematic illustrating client-side client-server interface 600B in accordance with some embodiments.

A command-line interface can include a command line-based program used in a command-line interpreter such as Bash or cmd.exe. As shown, the command-line interface 600A is configured to request information through a prompt for creating a new BRAIN such as a name for the new BRAIN.

The CLI is a tool configured to enables users to configure the AI engine. The CLI is especially useful for automation and connection (e.g., via piping) to other tools. Some actions that can be performed using the CLI include starting and naming a BRAIN, loading a file written in a pedagogical programming language, training the BRAIN, and connecting the BRAIN to a simulator.

The Instructor Module

The instructor module is a component of the system responsible for carrying out a training plan codified in a pedagogical programming language. Training can include teaching a neural network to get one or more outcomes, for example, on a simulator. The training can involve using a specific set of concepts, a curriculum, and lessons, which can be described in a file in a pedagogical programming language. The instructor module can train easier-to-understand tasks earlier than more complex tasks. Thus, the instructor module can train sub-concept nodes and then higher-level nodes. The instructor module can train sub-concept nodes that are dependent on other nodes after those other nodes are trained. However, multiple nodes in a graph may be trained in parallel. The instructor module can run simulations on the nodes with input data including statistics and feedback on results from the node being trained from the learner module. The learner module and instructor module can work with a simulator or other data source to iteratively train a node with different data inputs. The instructor module can reference a knowledge base of how to train a node efficiently by different ways of flowing data to one or more nodes in the topology graph in parallel, or, if dependencies exist, the instructor module can train serially with some portions of lessons taking place only after earlier dependencies have been satisfied. The instructor module can reference the dependencies in the topology graph, which the dependencies can come from a user specifying the dependencies and/or how the arrangement of nodes in the topology was instantiated. The instructor module can supply data flows from the data source such as a simulator in parallel to multiple nodes at the same time where computing resources and a dependency check allows the parallel training.

Learner Module

The learner module is a component of the system configured to carry out the actual execution of the low-level, underlying AI algorithms. In training mode, the learner module can instantiate a system conforming to what was proposed by the architect module, interface with the instructor module to carry out the computation and assess performance, and then execute the learning algorithm itself. In execution mode, the learner module can instantiate and execute an instance of the already trained system. Eventually, the learner module writes out network states for each trained sub-node and then a combination of the topological graph of the main node with all of the sub-nodes into a trained intelligence model referred to herein as a BRAIN. The learner module can also write the stored output of each node and why that node arrived at that output into the BRAIN, which gives explainability as to how and why the AI proposes a solution or arrives at an outcome.

Hyperlearner Module

The hyperlearner module can perform a comparison of a current problem to a previous problem in one or more databases. The hyperlearner module can reference archived, previously built and trained intelligence models to help guide the instructor module to train the current model of nodes. The hyperlearner module can parse an archive database of trained intelligence models, known past similar problems and proposed solutions, and other sources. The hyperlearner module can compare previous solutions similar to the solutions needed in a current problem as well as compare previous problems similar to the current problem to suggest potential optimal neural network topologies and training lessons and training methodologies.

The Architect Module

The architect module is the component of the system responsible for proposing and optimizing learning topologies (e.g., neural networks) based on mental models.

Neural networks can be based on a large collection of neural units loosely modeling the way a biological brain solves problems with large clusters of biological neurons connected by axons. Each neural unit is connected with many others, and links can be enforcing or inhibitory in their effect on the activation state of connected neural units. Each individual neural unit can have, for example, a summation function, which combines the values of all its inputs together. There may be a threshold function or limiting function on each connection and on the unit itself such that it must surpass it before it can propagate to other neurons. These systems are self-learning and trained rather than explicitly programmed and excel in areas where the solution or feature detection is difficult to express in a traditional computer program.

Neural networks can consist of multiple layers or a cube design, and the signal path can traverse from front to back. The goal of the neural network is to solve problems in the same way that the human brain would, although several neural networks are much more abstract. Modern neural network projects typically work with a few thousand and up to a few million neural units and millions of connections.

The architect module can take the codified mental model and pedagogy and propose a set of candidate low-level learning algorithms, topologies of a main concepts and sub-concepts, and configurations thereof the architect module believes will best be able to learn the concepts in the model. This is akin to the work that a data scientist does in the toolkit approach, or that the search system automates in the approach with statistical data analysis tools. Here, it is guided by the pedagogical program instead of being a broad search. The architect module can employ a variety of techniques to identify such models. The architect module can generate a directed graph of nodes or a low-level instantiation of a high-level mental model. The architect module can break down the problem to be solved into smaller tasks/concepts all factoring into the more complex main problem trying to be solved. The architect module can instantiate a main concept and layers of sub-concepts feeding into the main concept. The architect module can generate each concept including the sub-concepts with a tap that stores the output action/decision and the reason why that node reached that resultant output (e.g., what parameters dominated the decision and/or other factors that caused the node to reach that resultant output). This stored output of resultant output and the reasons why the node reached that resultant output can be stored in the trained intelligence model. The tap created in each instantiated node allows explainability for each step in an intelligence model on how a trained intelligence model produces its resultant output for a set of data input. The architect module can reference a database of algorithms to use as well as a database of network topologies to utilize. The architect module can reference a table or database of best suggested topology arrangements including how many layers of levels in a topology graph for a given problem, if available. The architect module also has logic to reference similar problems solved by comparing signatures. If the signatures are close enough, the architect module can try the topology used to optimally solve a problem stored in an archive database with a similar signature. The architect module can also instantiate multiple topology arrangements all to be tested and simulated in parallel to see which topology comes away with optimal results. The optimal results can be based on factors such as performance time, accuracy, computing resources needed to complete the training simulations, etc.

In some embodiments, for example, the architect module can be configured to propose a number of neural networks and heuristically pick an appropriate learning algorithm from a number of machine learning algorithms in one or more databases for each of the number of neural networks. The instructor and learner modules can be configured to train the number of neural networks in parallel. The number of neural networks can be trained in one or more training cycles with the training data from one or more training data sources. The AI engine or a predictor module thereof can subsequently instantiate a number of trained neural networks based on the concepts learned by the number of neural networks in the one or more training cycles, and the AI engine can identify a best trained neural network (e.g., by means of optimal results based on factors such as performance time, accuracy, etc.) among the number of trained neural networks.

The user can assist in building the topology of the nodes by setting dependencies for particular nodes. The architect module can generate and instantiate neural network topologies for all of the concepts needed to solve the problem in a distinct two-step process. The architect module can generate a description of the network concepts. The architect module can also take the description and instantiate one or more topological shapes, layers, or other graphical arrangements to solve the problem description. The architect module can select topology algorithms to use based on factors such as whether the type of output the current problem has either 1) an estimation output or 2) a discrete output and then factors in other parameters such as performance time to complete the algorithm, accuracy, computing resources needed to complete the training simulations, originality, amount of attributes, etc.

Compiler

The compiler module automates conversion and compiling of the pedagogical programming language describing the problem (main concept) and sub-concepts factoring into the problem. Each statement recited in the pedagogical programming language can be complied into a structured data object's defined fields, which can later be generated and instantiated into its own sub-concept node by the architect module. Each node can have one or more inputs one or more neural networks to process the input data and a resulting output decision/action. The compiled statements, commands, and other codifications fed into the AI compiler can be transformed into a lower level AI specification.

Simulator

If the curriculum trains using a simulation or procedural generation, the data for a lesson is not data to be passed to the learning system, but data is to be passed to the simulator. Otherwise, then the data can be optionally filtered/augmented in the lessons before being passed to the learning system. The simulator can use this data to configure itself, and the simulator can subsequently produce a piece of data for the learning system to use for training. This separation permits a proper separation of concerns. The simulator is the method of instruction, and the lesson provides a way to tune that method of instruction, which makes it more or less difficult depending on the current level of mastery exhibited by the learning system. A simulation can run on a local client machine and stream data to the remote AI engine for training. In such an embodiment, the client machine needs to remain connected to the AI engine while the BRAIN is training. However, if the client machine is disconnected from the server of the AI engine, it can automatically pick up where it left off when its reconnected.

Note, 1) simulations and procedural generation are a good choice versus data in a variety of circumstances; and 2) concepts are a good choice versus streams when you can more easily teach versus calculate.

Stream Oriented, Data-Flow Processing

A BRAIN server can, under the hood, operate on streams of data, and can thus be considered a data flow-processing system. Data can be streamed into the BRAIN server through a traditional program, the data can flow through the nodes in the BRAIN model (including recurrent flows), and processed output can be made available in either an immediate or asynchronous, event-based model to the caller. All data that flows through the system can be ephemeral, unless a user explicitly creates a persisted data store in their program. At its heart, a BRAIN can be a basic network of intelligent processing nodes that comprise a potentially recurrent network, hence the acronym "BRAIN."

Modes of Operation

A BRAIN server has at least three modes of operation: authoring/debugging, training, and execution (or prediction). In practice, all three can run concurrently, and most implementations of a BRAIN server are high-availability, multi-tenant, distributed systems. That being said, each individual user generally works in one mode of operation at a time.

Authoring/Debugging Mode

When in authoring/debugging mode, a BRAIN server can be tuned to assisting a user in iteratively developing a mental model and pedagogy. For example, in the authoring/debugging mode a user can set breakpoints on nodes in a BRAIN model, and when a breakpoint is hit the user can inspect the chain of stream processing leading up to that node. Even though a given node can represent a neural network or other complex AI learning system, because of the way training is conducted, the system can encode and decode from high-dimensional tensor representations into the output types associated with a concept. This does not mean that high-dimensional representations are necessarily collapsed between nodes, just that decoders are learned for all nodes. In addition to this direct model-inspection capability, an author can similarly debug curricula. For example, one can set a watch condition on a particular lesson and compare the actual training performance and adapted learning execution plan versus the canonical, codified lesson ordering. Advanced users can inspect the underlying learning algorithms themselves, and debugging tooling can assist in visualizing what was actually learned in concepts that are not understood as intended.

Since many developers might be concurrently working on a given BRAIN model, the authoring mode also handles keeping representations that are under development, in training, and deployed separate.

Training Mode

When in training mode the instructor module and the learner module are configured to i) instantiate the neural network conforming to the neural network proposed by the architect module and ii) train the neural network. To effect the foregoing, the BRAIN server can take compiled code and generate a BRAIN learning topology, and proceed to follow the curricula to teach the concepts as specified. Depending on the model, training can potentially take substantial amounts of time. Consequently, the BRAIN server can provide interactive context on the status of training. For example, the BRAIN server can show which nodes are actively being trained, the current belief about each node's mastery of its associated concept, overall and fine-grained accuracy and performance, the current training execution plan, and an estimate of completion time. As such, in some embodiments, the AI engine can be configured to provide one or more training status updates on training a neural network selected from i) an estimation of a proportion of a training plan completed for the neural network, ii) an estimation of a completion time for completing the training plan, iii) the one or more concepts upon which the neural network is actively training, iv) mastery of the neural network on learning the one or more concepts, v) fine-grained accuracy and performance of the neural network on learning the one or more concepts, and vi) overall accuracy and performance of the neural network on learning one or more mental models.

Because the process of building pedagogical programs is iterative, the BRAIN server in training mode can also provide incremental training. That is to say, if the code in the pedagogical programming language is altered with respect to a concept that comes after other concepts that have already been trained, those antecedent concepts do not need to be retrained.

Additionally, in training mode, the user is able to specify what constitutes satisfactory training should the program itself permit indefinite training.

When starting a training operation, the instructor module can first generate an execution plan. This is the ordering the instructor module intends to use when teaching the concepts, and, for each concept, the lessons the instructor module intends to teach in what order. While the execution plan is executing, the instructor module can jump back and forth between concepts and lessons to optimize the learning rate. By not being required to train each concept fully before starting to train dependent concepts, the system can naturally avoid certain systemic machine-learning problems such as overfitting. The major techniques used to determine when to switch between lessons and concepts for training are reinforcement learning and adaptive learning. For example, for a first main problem of determining an amount of bankruptcy filings in the United States, a first sub-node can be trained in a first lesson on how to determine bankruptcy filings in California. A second lesson can train the first sub-node on how to determine bankruptcy filings in California and York. Successive lessons on a node can build upon and augment earlier lessons that the node was trained on in a training session.

Execution Mode

When in execution mode or prediction mode, a predictor AI module can be configured to i) instantiate and execute the trained neural network on the training data for one or more predictions in the predicting mode. To effect the foregoing, a BRAIN server can take a trained BRAIN model, enable API endpoints so that data can be streamed to and from the model, and then optimize its distribution for performance. Because learned and specified data transformations can be functional in nature, the transformations can be automatically parallelized and distributed to hardware that can accelerate their execution. Text processing, for example, can be distributed to a cluster of machines with substantial CPU resources, while nodes leveraging deep learning might be similarly distributed to a cluster of machines with substantial GPU resources.

Operational management of the executing BRAIN model can also be undertaken in this mode. This includes monitoring data ingestion rates, execution performance (both in terms of speed and accuracy), logs, event subscriptions, or the like through an operational dashboard.

Other features of the AI systems and methods provided herein for authoring/debugging, training, and execution (or prediction) can be better understood with reference to the following:

Algorithm Selection

A first step a BRAIN server can take is to pick an appropriate learning algorithm to train a mental model. This is a notable step in training AI, and it is a step those without AI expertise cannot perform without expert guidance. The BRAIN server can have knowledge of many of the available learning algorithms, as well as a set of heuristics for picking an appropriate algorithm including an initial configuration to train from.

For example, if the BRAIN server picks Deep Q-Learning for training a mental model, it would also pick an appropriate topology, hyper-parameters, and initial weight values for synapses. A benefit of having the heuristics available to be used programmatically is that the BRAIN server is not limited to a single choice; it can select any number of possible algorithms, topologies, etc., train a number of BRAINS in parallel, and pick the best result.

The process of picking an appropriate algorithm, etc., is performed by a BRAIN that has been trained (and will continue to be trained) by the AI engine, meaning the BRAIN will get better at building BRAINs each time a new one is built. A trained AI-engine neural network such as a BRAIN thereby provides enabling AI for proposing neural networks from assembly code and picking appropriate learning algorithms from a number of machine learning algorithms in one or more databases for training the neural networks. The AI engine can be configured to continuously train the trained AI-engine neural network in providing the enabling AI for proposing the neural networks and picking the appropriate learning algorithms thereby getting better at building BRAINs.

The architect module can also use heuristics, mental model signatures, statistical distribution inference, and meta-learning in topology and algorithm selection:

First, the architect module can be configured to heuristically pick an appropriate learning algorithm from a number of machine learning algorithms in one or more databases for training the neural network proposed by the architect module. Many heuristics regarding the mental model can be used to inform what types of AI and machine learning algorithms can be used. For example, the data types used have a large influence. For this reason, the pedagogical programming language contains rich native data types in addition to the basic data types. If the architect module sees, for example, that an image is being used, a convolutional deep learning neural network architecture might be appropriate. If the architect module sees data that is temporal in nature (e.g., audio data, sequence data, etc.), then a recursive deep-learning neural network architecture like a long short-term memory ("LSTM") network might be more appropriate. The collection of heuristics can be generated by data science and machine learning/AI experts who work on the architect module codebase, and who attempt to capture the heuristics that they themselves use in practice.

The system can also calculate a signature for a mental model. These signatures are a form of hashing such that mental models that have similar machine learning algorithmic characteristics have similar signatures. These signatures can then be used in conjunction with heuristics and with meta-learning.

In addition to looking at the mental model, the architect module can also consider the pedagogy provided in the code of the pedagogical programming language. It can, for example, look at the statistical distribution of any data sets being used; and, in the case of simulators, it can ask the simulator to generate substantial amounts of data so as to determine the statistics of data that will be used during training. These distribution properties can further inform the heuristics used.

Meta-learning is an advanced technique used by the architect module. It is, as the name implies, learning about learning. What this means is that as the architect module can generate candidate algorithm choices and topologies for training, it can record this data along with the signature for the model and the resultant system performance. This data set can then be used in its own learning system. Thus the architect module, by virtue of proposing, exploring, and optimizing learning models, can observe what works and what doesn't, and use that to learn what models it should try in the future when it sees similar signatures.

To effect meta-learning, the AI engine can include a meta-learning module configured to keep a record such as a meta-learning record in one or more databases. The record can include i) the source code processed by the AI engine, ii) mental models of the source code and/or signatures thereof, iii) the training data used for training the neural networks, iv) the trained neural networks, v) how quickly the trained neural networks were trained to a sufficient level of accuracy, and vi) how accurate the trained neural networks became in making predictions on the training data.

For advanced users, low-level details of a learning topology can be explicitly specified completely or in part. The architect module can treat any such pinning of parameters as an override on its default behavior. In this way, specific algorithms can be provided, or a generated model can be pinned for manual refinement.

Guiding Training

Once an algorithm is chosen, the BRAIN server can proceed with training the BRAIN's mental model via curricula and the lessons thereof. The BRAIN server can manage the data streaming, data storage, efficient allocation of hardware resources, choosing when to train each concept, how much (or little) to train a concept given its relevance within the mental model (e.g., dealing with problems of overfitting and underfitting), and is generally responsible for producing a trained BRAIN based on the given mental model and curricula. The AI engine is thus configured to make determinations regarding i) when to train the neural network on each of the one or more concepts and ii) how extensively to train the neural network on each of the one or more concepts. Such determinations can be based on the relevance of each of one or more concepts in one or more predictions of a trained neural network based upon training data.

As is the case with picking an appropriate learning algorithm, guiding training—notably avoiding overfitting and underfitting—to produce an accurate AI solution is a task that requires knowledge and experience in training AIs, and the BRAIN server can have an encoded set of heuristics to manage this with little or no user involvement. Similarly, the process of guiding training is also a BRAIN that has been trained that will only get smarter with each BRAIN it trains.

The AI engine can also determine when to train each concept, how much (or little) to train each concept based on its relevance, and, ultimately, produce a trained BRAIN. Furthermore, the AI engine can utilize meta-learning. In meta-learning, the AI engine keeps a record of each program it's seen, the data it used for training, and the generated AIs that it made. It also records how fast those AIs trained and how accurate they became. The AI engine server learns over that dataset.

Learning Backends

Learning backends encode underlying detail needed to work with a particular AI or machine learning algorithm. The BRAIN server can provide many backends such as backends for deep learning. However, learning-algorithm authors can provide their own backends if desired. By architecting the BRAIN server in this way, code in a pedagogical programming language can include another level of abstraction from a particular approach. If a new learning algorithm is created that has superior performance to existing algorithms, all that need be added is a new backend. The architect module can then immediately start using the backend to build systems, and existing programs can be recompiled without modification to take advantage of the improved algorithms.

Online Learning

In addition to capabilities for migrating learned state, some implementations of the BRAIN server afford features to enable online learning. Since online learning can break the pure functional nature of nodes via state changes during runtime, another strategy that the system is configured to afford is persisting training data learned online using a data daemon, incrementally training the network at set intervals, and then redistributing the updated network as a functional block throughout the BRAIN server.

Migrations of Learned State

When a system has undergone substantial training achieving a learned state, and a subsequent change to the underlying mental models might necessitate retraining, it could be desirable to migrate the learned state rather than starting training from scratch. The BRAIN server can be configured to afford transitioning capabilities such that previously learned high dimensional representations can be migrated to appropriate, new, high dimensional representations. This can be achieved in a neural network by, for example, expanding the width of an input layer to account for alterations with zero-weight connections to downstream layers. The system can then artificially diminish the weights on connections from the input that are to be pruned until they hit zero and can then be fully pruned.

Deploy and Use

Once a BRAIN has been sufficiently trained, it can be deployed such that it can be used in a production application. The interface for using a deployed BRAIN is simple: the user submits data (of the same type as the BRAIN was trained with) to a BRAIN-server API and receives the BRAIN's evaluation of that data.

As a practical example of how to use a deployed BRAIN, a BRAIN can first be trained to recognize hand-written digits from the Mixed National Institute of Standards and Technology ("MNIST") dataset. An image can be created containing a handwritten digit, perhaps directly through a touch-based interface or indirectly by scanning a piece of paper with the handwritten digit written on it. The image can then be downsampled to a resolution of 28×28 and converted to grayscale, as this is the input schema used to train the example BRAIN. When submitted to the BRAIN-server through the BRAIN server API, the BRAIN can take the image as input and output a one-dimensional array of length 10 (whereby each array item represents the probability, as judged by the BRAIN, that the image is a digit corresponding to the index). The array could be the value returned to the user from the API, which the user could use as needed.

Though a linear approach to building a BRAIN is presented in some embodiments, an author-train-deploy workflow does not have to treated as a waterfall process. If the user decides further refinement of a BRAIN is needed, be it through additional training with existing data, additional training with new, supplemental data, or additional training with a modified version of the mental model or curricula used for training, the BRAIN-server is configured to support versioning of BRAINs so that the user can preserve (and possibly revert to) the current state of a BRAIN while refining the trained state of the BRAIN until a new, more satisfactory state is reached.

FIG. 7A provides a schematic illustrating an AI system 700A in accordance with some embodiments.

As shown in FIG. 7A, a user such as a software developer can interface with the AI system 700A through an online interface; however, the user is not limited to the online interface, and the online interface is not limited to that shown in FIG. 7A. With this in mind, the AI system 700A of FIG. 7A can enable a user to make API and web requests through a domain name system ("DNS"), which requests can be optionally filtered through a proxy to route the API requests to an API load balancer and the web requests to a web load balancer. The API load balancer can be configured to distribute the API requests among multiple BRAIN service containers running in a Docker network or containerization platform configured to wrap one or more pieces of software in a complete filesystem containing everything for execution including code, runtime, system tools, system libraries, etc. The web load balancer can be configured to distribute the web requests among multiple web service containers running in the Docker network. The Docker network or Docker BRAIN network can include central processing unit ("CPU") nodes and graphics processing unit ("GPU") nodes, the nodes of which Docker network can be autoscaled as needed. The CPU nodes can be utilized for most BRAIN-service containers running on the Docker network, and the GPU nodes can be utilized for the more computationally intensive components such as TensorFlow and the learner module. As further shown in FIG. 7A, a BRAIN-service engineer can interface with the AI system 700A through virtual private cloud ("VPC") gateway and a hardened bastion host configured to secure the Docker network. An Elastisearch-Logstash-Kibana ("ELK") stack cluster can be shared among all production clusters for dedicated monitoring and logging.

FIG. 7B provides a schematic illustrating an AI system 700B in accordance with some embodiments.

Following on the AI system 700A, the bastion host and one or more CPU nodes can be on a public subnet for bidirectional communication through an Internet gateway. One or more other CPU nodes, as well as the GPU nodes, can be on a private subnet communicatively coupled with the public subnet by means of a subnet therebetween. The one or more CPU nodes on the public subnet can be utilized by the compiler 222 of FIGS. 2A, 3A, and 5, and the architect module 326 of FIGS. 3A and 5. The one or more other CPU nodes on the private subnet can be utilized by the instructor module 324 of FIGS. 3A and 5, and the GPU nodes can be utilized by the learner module 328 and the predictor module 329 of FIGS. 3A and 5. As further shown in FIG. 7B, the private subnet can be configured to send outgoing communications to the Internet through a network address translation ("NAT") gateway.

Methods

One or more methods of an AI engine include, in some embodiments, enabling client interactions, compiling an assembly code, training an AI model, and instantiating a trained AI model. The client interactions can be enabled in one or more server-side client-server interfaces configured for client interactions with the AI engine such as submitting a source code for training the AI model or using the trained AI model for one or more predictions. The assembly code can be compiled from the source code, wherein a compiler is configured to generate the assembly code from the source code written in a pedagogical programming language. The source code can include a mental model of one or more concepts to be learned by the AI model using training data. The source code can also include curricula of one or more lessons for training the AI model on the one or more concepts. Each of the one or more lessons can be configured to optionally use a different flow of the training data. The AI model can be trained by one or more AI-engine modules including an instructor AI-engine module and a learner AI-engine module for training the AI model in one or more training cycles. The trained AI model can be instantiated by the AI engine based on the one or more concepts learned by the AI model in the one or more training cycles.

In such embodiments, the AI engine can further include pushing or pulling the training data. A training data manager of the AI engine can be configured for pushing or pulling the training data from the one or more training sources, each of which is selected from a simulator, a training data generator, a training data database, or a combination thereof.

In such embodiments, the AI engine can further include operating the AI engine in a training mode or a predicting mode during the one or more training cycles. In the training mode, the instructor module and the learner module can i) instantiate the AI model conforming to the AI model proposed by the architect module and ii) train the AI model. In the predicting mode, a predictor AI module can instantiate and execute the trained AI model on the training data for one or more predictions in the predicting mode.

In such embodiments, the AI engine can further include heuristically picking an appropriate learning algorithm. The AI engine can be configured for picking the appropriate learning algorithm from a number of machine learning algorithms in one or more databases for training the AI model proposed by the architect module.

In such embodiments, the AI engine can further include proposing one or more additional AI models to the foregoing, initial AI model; heuristically picking an appropriate learning algorithm for each of the one or more additional AI models; training the AI models in parallel; instantiating one or more additional trained AI models; and identifying a best trained AI model among the trained AI models. The architect module can be configured for proposing the one or more additional AI models. The AI engine can be configured for heuristically picking the appropriate learning algorithm from the number of machine learning algorithms in the one or more databases for each of the one or more additional AI models. The instructor module and the learner module can be configured for training the AI models in parallel, wherein the one or more additional AI models can also trained in one or more training cycles with the training data from the one or more training data sources. The AI engine can be configured to instantiate one or more additional trained AI models based on concepts learned by the one or more AI models in the one or more training cycles, and the AI engine can be configured to identify a best trained AI model among the trained AI models.

In such embodiments, the AI engine can further include providing enabling AI for proposing the AI models from the assembly code and picking the appropriate learning algorithms from the number of machine learning algorithms in the one or more databases for training the AI models. The AI engine can continuously train a trained AI-engine AI model to provide the enabling AI for proposing the AI models and picking the appropriate learning algorithms.

In such embodiments, the AI engine can further include keeping a record in the one or more databases with a meta-learning module. The record can include i) the source code processed by the AI engine, ii) mental models of the source code, iii) the training data used for training the AI models, iv) the trained AI models, v) how quickly the trained AI models were trained to a sufficient level of accuracy, and vi) how accurate the trained AI models became in making predictions on the training data.

In such embodiments, the AI engine can further include making certain determinations. Such determinations can include when to train the AI model on each of the one or more concepts. Such determinations can alternatively or additionally include how extensively to train the AI model on each of the one or more concepts. The determinations can be based on the relevance of each of the one or more concepts in one or more predictions of the trained AI model based upon the training data.

In such embodiments, the AI engine can further include providing one or more training status updates on training the AI model. Such training updates can include i) an estimation of a proportion of a training plan completed for the AI model, ii) an estimation of a completion time for completing the training plan, iii) the one or more concepts upon which the AI model is actively training, iv) mastery of the AI model on learning the one or more concepts, v) fine-grained accuracy and performance of the AI model on learning the one or more concepts, and/or vi) overall accuracy and performance of the AI model on learning one or more mental models.

Network

FIG. 8 illustrates a number of electronic systems and devices communicating with each other in a network environment in accordance with some embodiments. The network environment 800 has a communications network 820. The network 820 can include one or more networks selected from an optical network, a cellular network, the Internet, a Local Area Network ("LAN"), a Wide Area Network ("WAN"), a satellite network, a fiber network, a cable network, and combinations thereof. In some embodiments, the communications network 820 is the Internet. As shown, there may be many server computing systems and many client computing systems connected to each other via the communications network 820. However, it should be appreciated that, for example, a single client computing system can also be connected to a single server computing system. As such, FIG. 8 illustrates any combination of server computing systems and client computing systems connected to each other via the communications network 820.

The communications network 820 can connect one or more server computing systems selected from at least a first server computing system 804A and a second server computing system 804B to each other and to at least one or more client computing systems as well. The server computing systems 804A and 804B can be, for example, the one or more server systems 220 of FIGS. 2A and 3A. The server computing systems 804A and 804B can respectively optionally include organized data structures such as databases 806A and 806B. Each of the one or more server computing systems can have one or more virtual server computing systems, and multiple virtual server computing systems can be implemented by design. Each of the one or more server computing systems can have one or more firewalls to protect data integrity.

The at least one or more client computing systems can be selected from a first mobile computing device 802A (e.g., smartphone with an Android-based operating system), a second mobile computing device 802E (e.g., smartphone with an iOS-based operating system), a first wearable electronic device 802C (e.g., a smartwatch), a first portable computer 802B (e.g., laptop computer), a third mobile computing device or second portable computer 802F (e.g., tablet with an Android- or iOS-based operating system), a smart device or system incorporated into a first smart automobile 802D, a smart device or system incorporated into a first smart bicycle 802G, a first smart television 802H, a first virtual reality or augmented reality headset 804C, and the like. The client computing system 802B can be, for example, one of the one or more client systems 210 of FIGS. 2A and 3A, and any one or more of the other client computing systems (e.g., 802A, 802C, 802D, 802E, 802F, 802G, 802H, and/or 804C) can include, for example, the software application or the hardware-based system in which the trained neural network 106 can be deployed. Each of the one or more client computing systems can have one or more firewalls to protect data integrity.

It should be appreciated that the use of the terms "client computing system" and "server computing system" is intended to indicate the system that generally initiates a communication and the system that generally responds to the communication. For example, a client computing system can generally initiate a communication and a server computing system generally responds to the communication. No hierarchy is implied unless explicitly stated. Both functions can be in a single communicating system or device, in which case, the client-server and server-client relationship can be viewed as peer-to-peer. Thus, if the first portable computer 802B (e.g., the client computing system) and the server computing system 804A can both initiate and respond to communications, their communications can be viewed as peer-to-peer. Additionally, the server computing systems 804A and 804B include circuitry and software enabling communication with each other across the network 820.

Any one or more of the server computing systems can be a cloud provider. A cloud provider can install and operate application software in a cloud (e.g., the network 820 such as the Internet) and cloud users can access the application software from one or more of the client computing systems. Generally, cloud users that have a cloud-based site in the cloud cannot solely manage a cloud infrastructure or platform where the application software runs. Thus, the server computing systems and organized data structures thereof can be shared resources, where each cloud user is given a certain amount of dedicated use of the shared resources. Each cloud user's cloud-based site can be given a virtual amount of dedicated space and bandwidth in the cloud. Cloud applications can be different from other applications in their scalability, which can be achieved by cloning tasks onto multiple virtual machines at run-time to meet changing work demand. Load balancers distribute the work over the set of virtual machines. This process is transparent to the cloud user, who sees only a single access point.

Cloud-based remote access can be coded to utilize a protocol, such as Hypertext Transfer Protocol ("HTTP"), to engage in a request and response cycle with an application on a client computing system such as a web-browser application resident on the client computing system. The cloud-based remote access can be accessed by a smartphone, a desktop computer, a tablet, or any other client computing systems, anytime and/or anywhere. The cloud-based remote access is coded to engage in 1) the request and response cycle from all web browser-based applications, 3) the request and response cycle from a dedicated on-line server, 4) the request and response cycle directly between a native application resident on a client device and the cloud-based remote access to another client computing system, and 5) combinations of these.

In an embodiment, the server computing system 804A can include a server engine, a web page management component, a content management component, and a database management component. The server engine can perform basic processing and operating-system level tasks. The web page management component can handle creation and display or routing of web pages or screens associated with receiving and providing digital content and digital advertisements. Users (e.g., cloud users) can access one or more of the server computing systems by means of a Uniform Resource Locator ("URL") associated therewith. The content management component can handle most of the functions in the embodiments described herein. The database management component can include storage and retrieval tasks with respect to the database, queries to the database, and storage of data.

In some embodiments, a server computing system can be configured to display information in a window, a web page, or the like. An application including any program modules, applications, services, processes, and other similar software executable when executed on, for example, the server computing system 804A, can cause the server computing system 804A to display windows and user interface screens in a portion of a display screen space. With respect to a web page, for example, a user via a browser on the client computing system 802B can interact with the web page, and then supply input to the query/fields and/or service presented by the user interface screens. The web page can be served by a web server, for example, the server computing system 804A, on any Hypertext Markup Language ("HTML") or Wireless Access Protocol ("WAP") enabled client computing system (e.g., the client computing system 802B) or any equivalent thereof. The client computing system 802B can host a browser and/or a specific application to interact with the server computing system 804A. Each application has a code scripted to perform the functions that the software component is coded to carry out such as presenting fields to take details of desired information. Algorithms, routines, and engines within, for example, the server computing system 804A can take the information from the presenting fields and put that information into an appropriate storage medium such as a database (e.g., database 806A). A comparison wizard can be scripted to refer to a database and make use of such data. The applications may be hosted on, for example, the server computing system 804A and served to the specific application or browser of, for example, the client computing system 802B. The applications then serve windows or pages that allow entry of details.

Computing Systems

FIG. 9 illustrates a computing system 900 that can be, wholly or partially, part of one or more of the server or client computing devices in accordance with some embodiments. With reference to FIG. 9, components of the computing system 900 can include, but are not limited to, a processing unit 920 having one or more processing cores, a system memory 930, and a system bus 921 that couples various system components including the system memory 930 to the processing unit 920. The system bus 921 may be any of several types of bus structures selected from a memory bus or memory controller, a peripheral bus, and a local bus using any of a variety of bus architectures.

Computing system 900 typically includes a variety of computing machine-readable media. Computing machine-readable media can be any available media that can be accessed by computing system 900 and includes both volatile and nonvolatile media, and removable and non-removable media. By way of example, and not limitation, computing machine-readable media use includes storage of information, such as computer-readable instructions, data structures, other executable software or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media. As an example, some client computing systems on the network 820 of FIG. 8 might not have optical or magnetic storage.

The system memory 930 includes computer storage media in the form of volatile and/or nonvolatile memory such as read only memory (ROM) 931 and random access memory (RAM) 932. A basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, FIG. 9 illustrates that RAM 932 can include a portion of the operating system 934, application programs 935, other executable software 936, and program data 937.

The computing system 900 can also include other removable/non-removable volatile/nonvolatile computer storage media. By way of example only, FIG. 9 illustrates a solid-state memory 941. Other removable/non-removable, volatile/nonvolatile computer storage media that can be used in the example operating environment include, but are not limited to, USB drives and devices, flash memory cards, solid state RAM, solid state ROM, and the like. The solid-state memory 941 is typically connected to the system bus 921 through a non-removable memory interface such as interface 940, and USB drive 951 is typically connected to the system bus 921 by a removable memory interface, such as interface 950.

The drives and their associated computer storage media discussed above and illustrated in FIG. 9, provide storage of computer readable instructions, data structures, other executable software and other data for the computing system 900. In FIG. 9, for example, the solid state memory 941 is illustrated for storing operating system 944, application programs 945, other executable software 946, and program data 947. Note that these components can either be the same as or different from operating system 934, application programs 935, other executable software 936, and program data 937. Operating system 944, application programs 945, other executable software 946, and program data 947 are given different numbers here to illustrate that, at a minimum, they are different copies.

A user may enter commands and information into the computing system 900 through input devices such as a keyboard, touchscreen, or software or hardware input buttons 962, a microphone 963, a pointing device and/or scrolling input component, such as a mouse, trackball or touch pad. The microphone 963 can cooperate with speech recognition software. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a hand-held device, a server, a router, a network PC, a peer device or other common network node, and typically includes many or all of the elements described above relative to the computing system 900. The logical connections depicted in FIG. 9 can include a personal area network ("PAN") 972 (e.g., Bluetooth®), a local area network ("LAN") 971 (e.g., Wi-Fi), and a wide area network ("WAN") 973 (e.g., cellular network), but may also include other networks. Such networking environments are commonplace in offices, enterprise-wide computer networks, intranets and the Internet. A browser application may be resident on the computing device and stored in the memory.

When used in a LAN networking environment, the computing system 900 is connected to the LAN 971 through a network interface or adapter 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, FIG. 9 illustrates remote application programs 985 as residing on remote computing device 980. It will be appreciated that the network connections shown are examples and other means of establishing a communications link between the computing devices may be used.

As discussed, the computing system 900 can include a processor 920, a memory (e.g., ROM 931, RAM 932, etc.), a built in battery to power the computing device, an AC power input to charge the battery, a display screen, a built-in Wi-Fi circuitry to wirelessly communicate with a remote computing device connected to network.

It should be noted that the present design can be carried out on a computing system such as that described with respect to FIG. 9. However, the present design can be carried out on a server, a computing device devoted to message handling, or on a distributed system in which different portions of the present design are carried out on different parts of the distributed computing system.

Another device that may be coupled to bus 921 is a power supply such as a DC power supply (e.g., battery) or an AC adapter circuit. As discussed above, the DC power supply may be a battery, a fuel cell, or similar DC power source that needs to be recharged on a periodic basis. A wireless communication module can employ a Wireless Application Protocol to establish a wireless communication channel. The wireless communication module can implement a wireless networking standard.

In some embodiments, software used to facilitate algorithms discussed herein can be embodied onto a non-transitory machine-readable medium. A machine-readable medium includes any mechanism that stores information in a form readable by a machine (e.g., a computer). For example, a non-transitory machine-readable medium can include read only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile apps, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. An artificial intelligence ("AI") engine hosted on one or more remote servers configured to cooperate with one or more databases, comprising:
   one or more AI-engine modules including
      an architect module,
      an instructor module, and
      a learner module,
      wherein the architect module is configured to propose an AI model from an assembly code, and
      wherein the instructor module and the learner module are configured to train the AI model in one or more training cycles with training data from one or more training data sources,
      wherein the AI engine is configured to operate in a training mode or a predicting mode during the one or more training cycles,
      wherein, in the training mode, the instructor module and the learner module are configured to:
         i) instantiate the AI model conforming to the AI model proposed by the architect module, and
         ii) train the AI model with a curricula of one or more lessons, and
      wherein, in the predicting mode, a predictor AI-engine module is configured to: i) instantiate and execute the trained AI model on the training data for the one or more predictions in the predicting mode;
      wherein the assembly code is generated from a source code written in a pedagogical programming language,
      wherein the source code includes
         a mental model of one or more concept modules to be learned by the AI model using the training data and
         the curricula of the one or more lessons for training the AI model on the one or more concept modules, and
      wherein the AI engine is configured to instantiate the trained AI model based on the one or more concept modules learned by the AI model in the one or more training cycles; and
   one or more server-side client-server interfaces configured to enable client interactions with the AI engine in one or both client interactions selected from
      submitting the source code for training the AI model and
      using the trained AI model for one or more predictions based upon the training data
      wherein the learner module and the instructor module are configured to pick out the curricula of the one or more lessons, thereby significantly cutting down on training time, memory, and computing cycles used by the AI engine for training the AI model.

2. The AI engine of claim 1,
wherein the one or more server-side client-server interfaces are configured to cooperate with one or more client-side client-server interfaces selected from a command-line interface, a graphical interface, a web-based interface, or a combination thereof.

3. The AI engine of claim 1, further comprising
a compiler configured to generate the assembly code from the source code; and
a training data manager configured to push or pull the training data from one or more training data sources selected from a simulator, a training data generator, a training data database, or a combination thereof.

4. The AI engine of claim 1,
wherein the AI engine is configured to heuristically pick an appropriate learning algorithm from a plurality of machine learning algorithms in the one or more databases for training the AI model proposed by the architect module.

5. The AI engine of claim 4,
wherein the architect module is configured to propose one or more additional AI models,
wherein the AI engine is configured to heuristically pick an appropriate learning algorithm from the plurality of machine learning algorithms in the one or more databases for each of the one or more additional AI models,
wherein the instructor module and the learner module are configured to train the AI models in parallel,
wherein the one or more additional AI models are also trained in one or more training cycles with the training data from one or more training data sources,
wherein the AI engine is configured to instantiate one or more additional trained AI models based on the concept modules learned by the one or more AI models in the one or more training cycles, and
wherein the AI engine is configured to identify a best trained AI model among the trained AI models.

6. The AI engine of claim 5, further comprising:
a trained AI-engine AI model,
wherein the trained AI-engine AI model provides enabling AI for proposing the AI models from the assembly code and picking the appropriate learning algorithms from the plurality of machine learning algorithms in the one or more databases for training the AI models, and
wherein the AI engine is configured to continuously train the trained AI-engine AI model in providing the enabling AI for proposing the AI models and picking the appropriate learning algorithms.

7. The AI engine of claim 5, further comprising:
a meta-learning module configured to keep a record in the one or more databases for
   i) the source code processed by the AI engine,
   ii) mental models of the source code,
   iii) the training data used for training the AI models,
   iv) the trained AI models,
   v) how quickly the trained AI models were trained to a sufficient level of accuracy, and
   vi) how accurate the trained AI models became in making predictions on the training data.

8. The AI engine of claim 1,
wherein the AI engine is configured to make determinations regarding
   i) when to train the AI model on each of the one or more concept modules and
   ii) how extensively to train the AI model on each of the one or more concept modules, and
wherein the determinations are based on a relevance of each of the one or more concept modules in one or more predictions of the trained AI model based upon the training data.

9. The AI engine of claim 1,
wherein the AI engine is configured to provide one or more training status updates on training the AI model selected from
  i) an estimation of a proportion of a training plan completed for the AI model,
  ii) an estimation of a completion time for completing the training plan,
  iii) the one or more concept modules upon which the AI model is actively training,
  iv) mastery of the AI model on learning the one or more concept modules,
  v) fine-grained accuracy and performance of the AI model on learning the one or more concept modules, and
  vi) overall accuracy and performance of the AI model on learning one or more mental models.

10. A method for an artificial intelligence ("AI") engine hosted on one or more remote servers configured to cooperate with one or more databases, comprising:
  proposing an AI model,
    wherein the AI engine includes an architect AI-engine module for proposing the AI model from an assembly code;
  training the AI model,
    wherein the AI engine includes an instructor AI-engine module and a learner AI-engine module for training the AI model in one or more training cycles with training data from one or more training data sources;
    wherein the AI engine is configured to operate in a training mode or a predicting mode during the one or more training cycles,
    wherein, in the training mode, the instructor AI-engine module and the learner AI-engine module are configured to:
      i) instantiate the AI model conforming to the AI model proposed by the architect AI-engine module, and
      ii) train the AI model with a curricula of one or more lessons, and
    wherein, in the predicting mode, a predictor AI-engine module is configured to: i) instantiate and execute the trained AI model on the training data for the one or more predictions in the predicting mode;
  compiling the assembly code from a source code,
    wherein a compiler is configured to generate the assembly code from the source code written in a pedagogical programming language,
    wherein the source code includes
      a mental model of one or more concept modules to be learned by the AI model using the training data and
      the curricula of one or more lessons for training the AI model on the one or more concept modules;
  instantiating the trained AI model,
    wherein the AI engine is configured for instantiating the trained AI model based on the concept modules learned by the AI model in the one or more training cycles; and
  enabling client interactions,
    wherein one or more server-side client-server interfaces are configured for enabling client interactions with the AI engine in one or both client interactions selected from
      submitting the source code for training the AI model and
      using the trained AI model for one or more predictions based upon the training data.

11. The method of claim 10, further comprising:
  pushing or pulling the training data,
    wherein a training data manager is configured for pushing or pulling the training data from one or more training sources selected from a simulator, a training data generator, a training data database, or a combination thereof.

12. The method of claim 10, further comprising:
  heuristically picking an appropriate learning algorithm,
    wherein the AI engine is configured for picking the appropriate learning algorithm from a plurality of machine learning algorithms in the one or more databases for training the AI model proposed by the architect AI-engine module.

13. The method of claim 12, further comprising:
  proposing one or more additional AI models,
    wherein the architect AI-engine module is configured for proposing the one or more additional AI models;
  heuristically picking an appropriate learning algorithm from the plurality of machine learning algorithms in the one or more databases with the AI engine for each of the one or more additional AI models;
  training the AI models in parallel with the instructor AI-engine module and learner AI-engine module,
    wherein the one or more additional AI models are also trained in one or more training cycles with the training data from one or more training data sources;
  instantiating one or more additional trained AI models with the AI engine based on the concept modules learned by the one or more AI models in the one or more training cycles; and
  identifying a best trained AI model among the trained AI models with the AI engine.

14. The method of claim 13, further comprising:
  providing enabling AI for proposing the AI models from the assembly code and picking the appropriate learning algorithms from the plurality of machine learning algorithms in the one or more databases for training the AI models; and
  continuously training a trained AI-engine AI model with the AI engine to provide the enabling AI for proposing the AI models and picking the appropriate learning algorithms.

15. The method of claim 13, further comprising:
  keeping a record in the one or more databases with a meta-learning module,
    wherein the record includes
      i) the source code processed by the AI engine,
      ii) mental models of the source code,
      iii) the training data used for training the AI models,
      iv) the trained AI models,
      v) how quickly the trained AI models were trained to a sufficient level of accuracy, and
      vi) how accurate the trained AI models became in making predictions on the training data.

16. The method of claim 10, further comprising:
  making determinations with the AI engine regarding
    i) when to train the AI model on each of the one or more concept modules and
    ii) how extensively to train the AI model on each of the one or more concept modules,
  wherein the determinations are based on a relevance of each of the one or more concept modules in one or more predictions of the trained AI model based upon the training data.

17. The method of claim 10, further comprising:
providing one or more training status updates with the AI engine on training the AI model,
wherein the one or more training status updates are selected from
  i) an estimation of a proportion of a training plan completed for the AI model,
  ii) an estimation of a completion time for completing the training plan,
  iii) the one or more concept modules upon which the AI model is actively training,
  iv) mastery of the AI model on learning the one or more concept modules,
  v) fine-grained accuracy and performance of the AI model on learning the one or more concept modules, and
  vi) overall accuracy and performance of the AI model on learning one or more mental models.

18. An artificial intelligence ("AI") engine hosted on one or more computers configured to cooperate with one or more databases, comprising:
  one or more AI-engine modules including
    an architect module configured to propose an AI model based on an executable code defining a mental model of one or more concept modules to be learned by the AI model using training data from one or more training data sources,
    an instructor module, and
    a learner module,
    wherein the instructor module and the learner module are configured to train the AI model in one or more training cycles with the training data,
    wherein the AI engine is configured to operate in a training mode or a predicting mode during the one or more training cycles,
    wherein, in the training mode, the instructor module and the learner module are configured to instantiate the AI model as proposed by the architect module, and train the AI model with a curricula of one or more lessons, and
    wherein, in the predicting mode, a predictor AI-engine module is configured to instantiate and execute the trained AI model on the training data for the one or more predictions in the predicting mode.

19. The AI engine of claim 18, wherein the AI engine is configured to heuristically pick an appropriate learning algorithm from a plurality of machine learning algorithms in the one or more databases for training the AI model proposed by the architect module.

20. The AI engine of claim 19, further comprising:
  a trained AI-engine AI model,
  wherein the trained AI-engine AI model provides enabling AI for proposing the AI models from an assembly code and picking the appropriate learning algorithms from a plurality of machine learning algorithms in the one or more databases for training AI models, and
  wherein the AI engine is configured to continuously train the trained AI-engine AI model in providing the enabling AI for proposing the AI models and picking the appropriate learning algorithms.

* * * * *